(12) United States Patent
Moriwaki

(10) Patent No.: US 7,816,258 B2
(45) Date of Patent: Oct. 19, 2010

(54) METHOD FOR MANUFACTURING ELECTRO-OPTIC DEVICE SUBSTRATE WITH TITANIUM SILICIDE REGIONS FORMED WITHIN

(75) Inventor: Minoru Moriwaki, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 227 days.

(21) Appl. No.: 11/758,365

(22) Filed: Jun. 5, 2007

(65) Prior Publication Data

US 2008/0012022 A1    Jan. 17, 2008

(30) Foreign Application Priority Data

Jul. 12, 2006    (JP)    ............... 2006-191089

(51) Int. Cl.
    *H01L 21/336*    (2006.01)
(52) U.S. Cl. .................. 438/649; 438/151; 438/682; 438/683; 257/E29.151
(58) Field of Classification Search ................ 438/649, 438/655–657, 660–664, 682, 683, 151; 257/E29.151
    See application file for complete search history.

(56) References Cited

U.S. PATENT DOCUMENTS

| | | | |
|---|---|---|---|
| 5,191,453 A | 3/1993 | Okumura | |
| 5,300,449 A | 4/1994 | Okumura | |
| 6,074,900 A * | 6/2000 | Yamazaki et al. | ........... 438/164 |
| 6,127,702 A | 10/2000 | Yamazaki et al. | |
| 6,507,069 B1 * | 1/2003 | Zhang et al. | ............... 257/336 |
| 6,593,219 B2 * | 7/2003 | Matsumoto et al. | ......... 438/592 |
| 6,773,971 B1 | 8/2004 | Zhang et al. | |
| 6,787,407 B2 | 9/2004 | Nakamura et al. | |
| 6,821,827 B2 | 11/2004 | Nakamura et al. | |
| 6,906,383 B1 | 6/2005 | Zhang et al. | |
| 7,183,614 B2 | 2/2007 | Zhang et al. | |
| 7,339,235 B1 | 3/2008 | Yamazaki et al. | |
| 2005/0054181 A1 | 3/2005 | Nakamura et al. | |
| 2007/0138473 A1 | 6/2007 | Zhang et al. | |

FOREIGN PATENT DOCUMENTS

| | | |
|---|---|---|
| JP | A-03-080226 | 4/1991 |
| JP | A-08-032081 | 2/1996 |
| JP | A-08-046207 | 2/1996 |
| JP | A-10-093100 | 4/1998 |
| JP | A-2000-200910 | 7/2000 |
| JP | A-2000-206566 | 7/2000 |
| JP | A 2005-158935 | 6/2005 |
| JP | A 2005-203675 | 7/2005 |
| WO | WO 01/48797 A1 | 7/2001 |

\* cited by examiner

*Primary Examiner*—Hung Vu
*Assistant Examiner*—Vernon P Webb
(74) *Attorney, Agent, or Firm*—Oliff & Berridge PLC

(57) ABSTRACT

An electro-optic device substrate includes a base and a TFT element having a source region and a drain region disposed on the base. The TFT element includes a silicon layer in the source region or the drain region, and the silicon layer at least partially includes a silicided portion. The electro-optic device substrate also includes a metal wire connected to the silicided portion of the silicon layer.

3 Claims, 17 Drawing Sheets

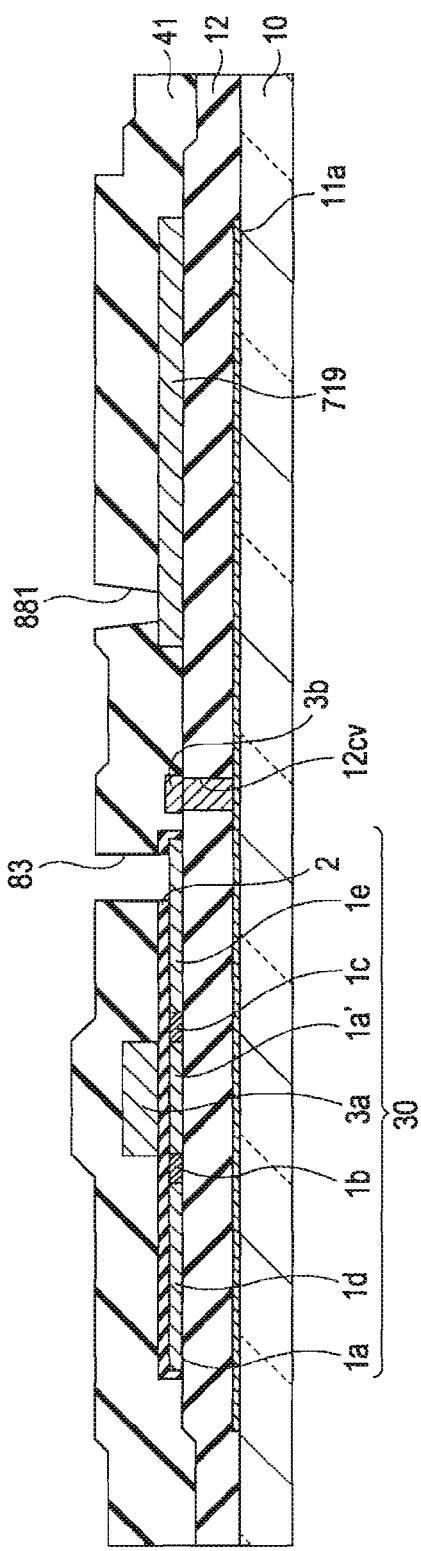
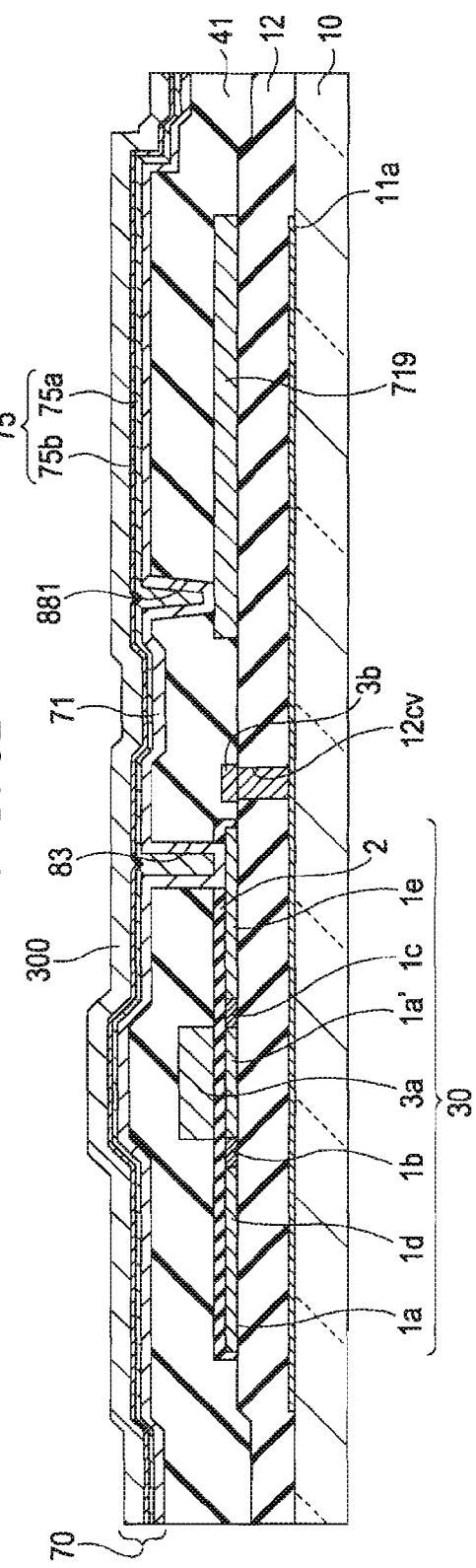
FIG. 6D
FIG. 6E

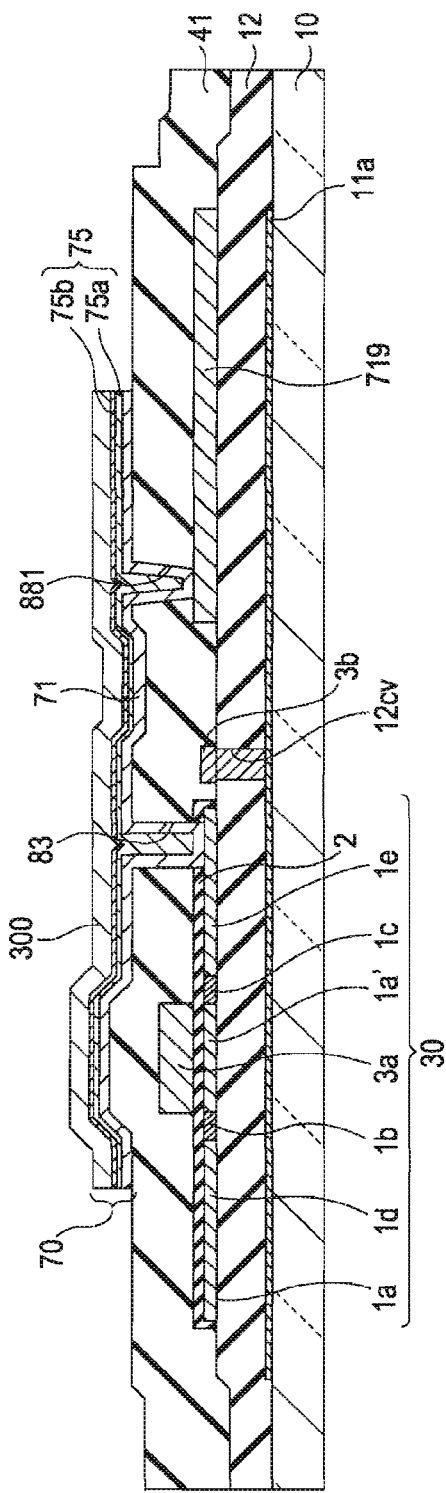
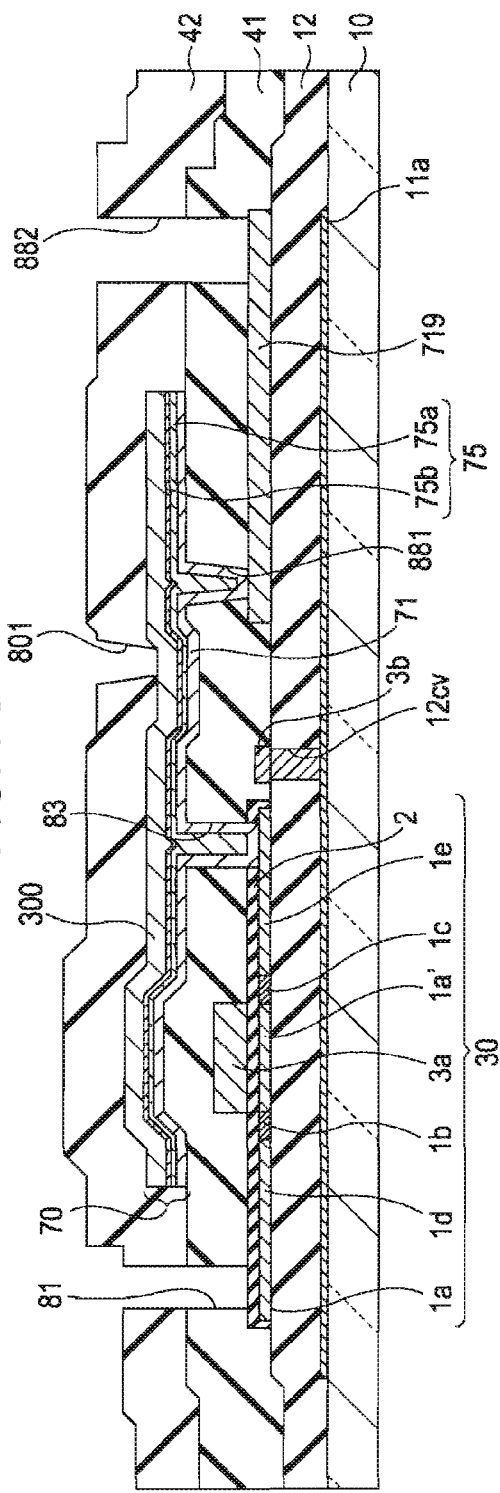

METHOD FOR MANUFACTURING ELECTRO-OPTIC DEVICE SUBSTRATE WITH TITANIUM SILICIDE REGIONS FORMED WITHIN

BACKGROUND

1. Technical Field

The present invention relates to an electro-optic device substrate, an electro-optic device, an electronic apparatus, and a method for manufacturing the electro-optic device substrate.

2. Related Art

In general, electro-optic devices, such as liquid crystal display devices, use an electro-optic device substrate including TFT (thin film transistor) elements as switching elements and peripheral circuits. In such electro-optic devices, pixels are formed increasingly more precisely and finer to increase the amount of displayed information and enhance the display quality. Accordingly, the TFT elements, and eventually the contact areas of the TFT elements with wires, tend to be reduced more and more. Consequently, the contact resistance between the TFT element and the wire is increased, thereby causing writing failures, such as lack of written data.

In order to prevent the increase in contact resistance, for example, Japanese Unexamined Patent Application Publication No. 2005-203675 has disclosed that a layer is formed between the source/drain region and the wire, and that the connection between the TFT element and the wire is established in this layer.

In addition, the increase of the contact resistance between the TFT element and the wire can occur due to the following reason. For example, when a contact hole is formed in an insulating interlayer overlying the source/drain region of the TFT element, the contact hole undesirably passes through the silicon layer of the source/drain region, so that the contact between the wire and the silicon layer may be established at the section of the silicon layer. This is caused when the etching rate for forming the contact hole is varied. In this instance, the contact area between the wire and the source/drain region is reduced to increase the contact resistance.

In order to prevent the increase in contact resistance caused by the above reason, Japanese Unexamined Patent Application Publication No. 2005-158935 has disclosed a technique in which an electroconductive relay layer is formed over the source/drain region to prevent the contact hole from passing through the silicon layer.

Unfortunately, those techniques for preventing the increase in contact resistance require an additional photomask, and thus make the manufacturing process complicated.

SUMMARY

An advantage of some aspects of the invention is that the contact resistance between a wire and the source/drain region of a TFT element can be reduced without using an additional photomask. In addition, even if the contact hole passes through the source/drain region, the wire can be connected to the source/drain region with a low resistance.

According to an aspect of the invention, there is provided an electro-optic device substrate including a base and a TFT element having a source region and a drain region on the base. The TFT element includes a silicon layer in the source region or the drain region. The silicon layer is at least partially silicided. The electro-optic device substrate also includes a metal wire connected to the silicided portion of the silicon layer.

In this structure, the silicon layer and the metal wire are connected to each other with the silicided portion therebetween, and thus the contact resistance can be reduced in comparison with the case where the silicon layer and the metal wire are directly connected. Thus, an ohmic contact is established between the silicon layer and the metal wire in the TFT element with a low resistance. Consequently, the writing characteristics of the TFT element are enhanced, and accordingly a high-contrast and high display-quality electro-optic device can be achieved. The resulting electro-optic device can include high-density circuits and precise fine pixels and accordingly exhibits high display quality.

Preferably, the silicon layer has a through hole therethrough whose inner wall is silicided, and the metal wire is connected to the silicon layer at the inner wall of the through hole.

Thus, the connection of the silicon layer with the metal wire is established only in the through hole. Since the silicon layer and the metal wire are connected at the connection point, that is, at the inner wall of the through hole with the silicided portion therebetween, the contact resistance can be reduced in comparison with the case where the silicon layer and the metal wire are directly connected to each other. Accordingly, sufficient electroconductivity can be ensured even if the silicon layer has a small thickness and the inner wall of the through hole has a small area.

Preferably, the silicided portion of the silicon layer contains titanium silicide.

Preferably, the metal wire includes a first metal layer connected to the silicided portion of the silicon layer and a second metal layer, and the first metal layer has a lower reflectance than the second metal layer and substantially covers the surface of the base side of the second metal layer.

This structure can reduce the reflection from the metal wire of light coming through the base. Thus, the photo-leakage current from the TFT element caused by the reflection can be reduced and high-quality display can be achieved without flicker or nonuniformity.

According to another aspect of the invention, an electro-optic device is provided which includes the electro-optic device substrate and an electrooptic material in contact with the electro-optic device substrate.

The electro-optic device can achieve high-contrast, high-quality display, and can be downsized.

According to still another aspect of the invention, an electronic apparatus including the electro-optic device is provided.

The electronic apparatus can achieve high-contrast, high-quality display, and can be downsized.

According to still another aspect of the invention, a method for manufacturing the electro-optic device substrate is provided. In the method, a TFT element having a source region and a drain region is formed on a base. The TFT element includes a silicon layer in the source region or the drain region. A titanium layer is formed so as to be in contact with at least part of the silicon layer in an atmosphere. A titanium nitride layer is formed on the titanium layer in the same atmosphere as the titanium layer. The base having the layers up to the titanium nitride layer is annealed to silicide the portion of the silicon layer in contact with the titanium layer, thereby forming a titanium silicide layer.

Thus, a silicon/titanium/titanium nitride multilayer structure is formed through the steps of forming the TFT element, the titanium layer, and the titanium nitride layer. In the method, the titanium nitride layer is formed in the same atmosphere as the titanium layer (for example, in the same vacuum chamber). Consequently, the titanium layer is prevented from coming into contact with air to react. In the subsequent annealing step, the silicon layer and the titanium layer is allowed to react with each other by annealing, thereby forming a titanium silicide layer. In the resulting electro-optic device substrate, the silicon layer of the TFT element is connected to the metal wire with the silicide layer therebetween. Consequently, the contact resistance is reduced in comparison with the case where the silicon layer and the metal wire are directly connected to each other. Preferably, in the method, annealing is successively performed after forming the titanium nitride layer without performing any other step in between.

Preferably, the annealing is performed at a temperature in the range of 300 to 400° C.

Annealing at a temperature of 300° C. or more can form a silicide layer. Annealing a temperature of 400° C. or less can reduce nonuniformity of the silicide layer. Hence, the method can form a favorable silicide layer.

BRIEF DESCRIPTION OF THE DRAWINGS

The invention will be described with reference to the accompanying drawings, wherein like numbers reference like elements.

FIGS. 6A to 6E are sectional views showing a manufacturing process of a TFT substrate and a liquid crystal display device in order of steps.

FIGS. 7A to 7D are sectional views showing the manufacturing process of the TFT substrate and the liquid crystal display device in order of steps.

DESCRIPTION OF EXEMPLARY EMBODIMENTS

Embodiments of the invention will be described with reference to the drawings. The components and members shown in each figure are illustrated on different scales so as to be recognized.

First Embodiment

A: TFT Substrate and Liquid Crystal Display Device

Figure 1A:
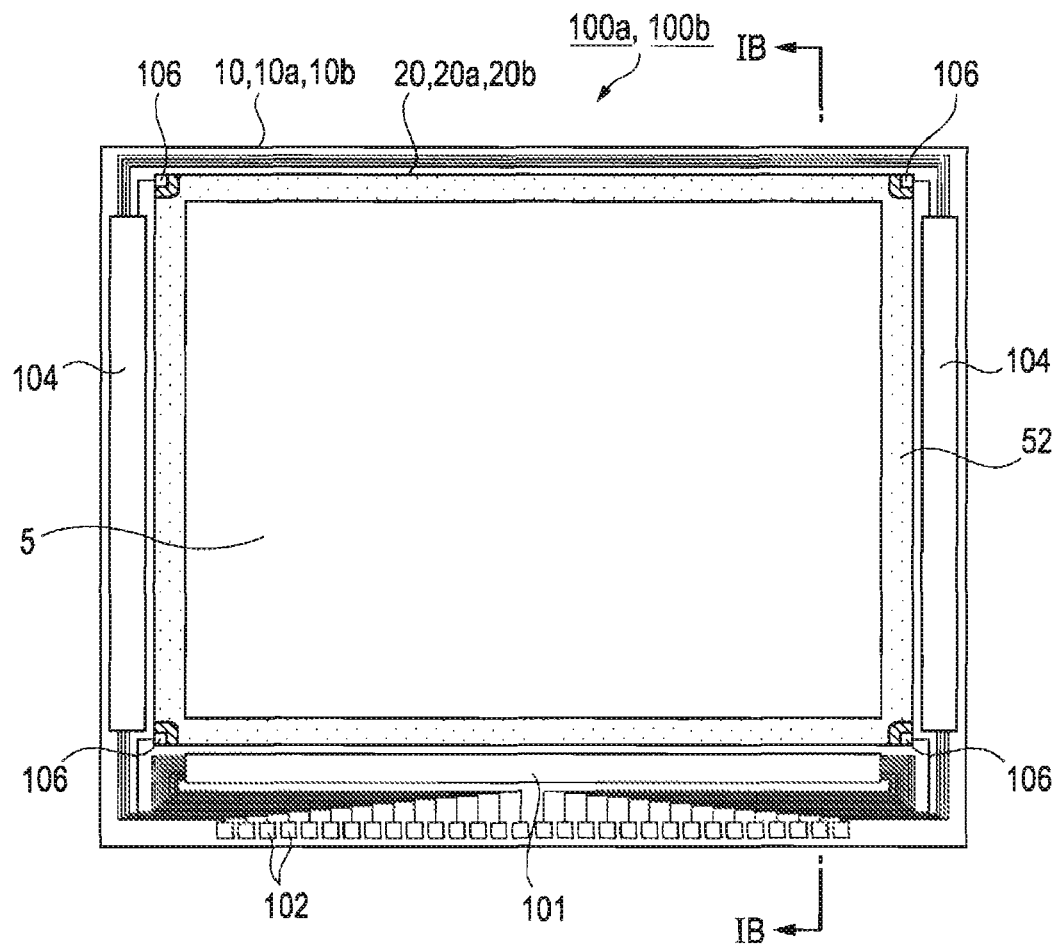
FIG. 1A is a plan view of a liquid crystal display device according to an embodiment of the invention.
Figure 1B:
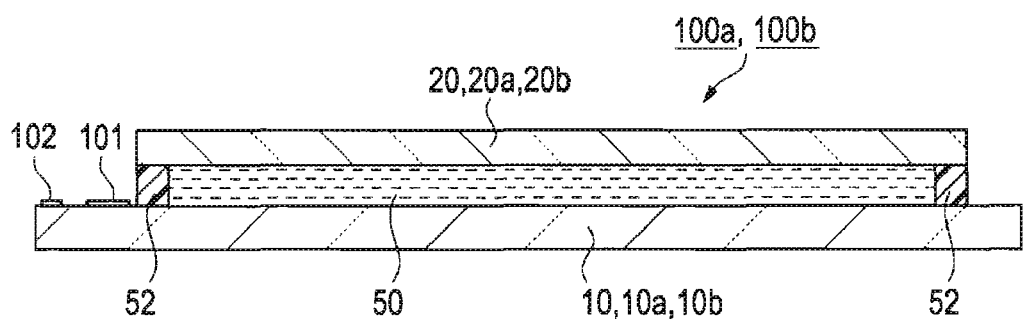
FIG. 1B is a sectional view of the liquid crystal display device shown in FIG. 1A.

FIG. 1A is a plan view of a liquid crystal display device 100a according to a first embodiment of the invention and FIG. 1B is a sectional view taken along line IB-IB of FIG. 1A.

The liquid crystal display device 190a, which is an embodiment of an electro-optic device of the invention, includes a TFT substrate 19a including, for example, a quartz or glass base 10 and an opposing substrate 20a including, for example, a quartz or glass base 20. The TFT substrate 10a corresponds to an electro-optic device substrate of the invention. The TFT substrate 10a and the opposing substrate 20a are bonded together with a frame-like sealant 52 therebetween, and the space surrounded by the sealant 52 between the two substrates is defined as an image display region 5. The image display region 5 is filled with liquid crystal, to form a liquid crystal layer 50. The liquid crystal corresponds to an electrooptic material of the invention. A data line driving circuit 101 and external, connection terminals 102 are disposed along a side of the TFT substrate 10a in a peripheral circuit region outside the sealant 52. Scanning line driving circuits 104 are provided along two sides adjacent to that side. In the corners of the opposing substrate 20a, vertical conductors 106 are disposed to establish electrical continuity between the TFT substrate 10a and the opposing substrate 20a.

Figure 2:
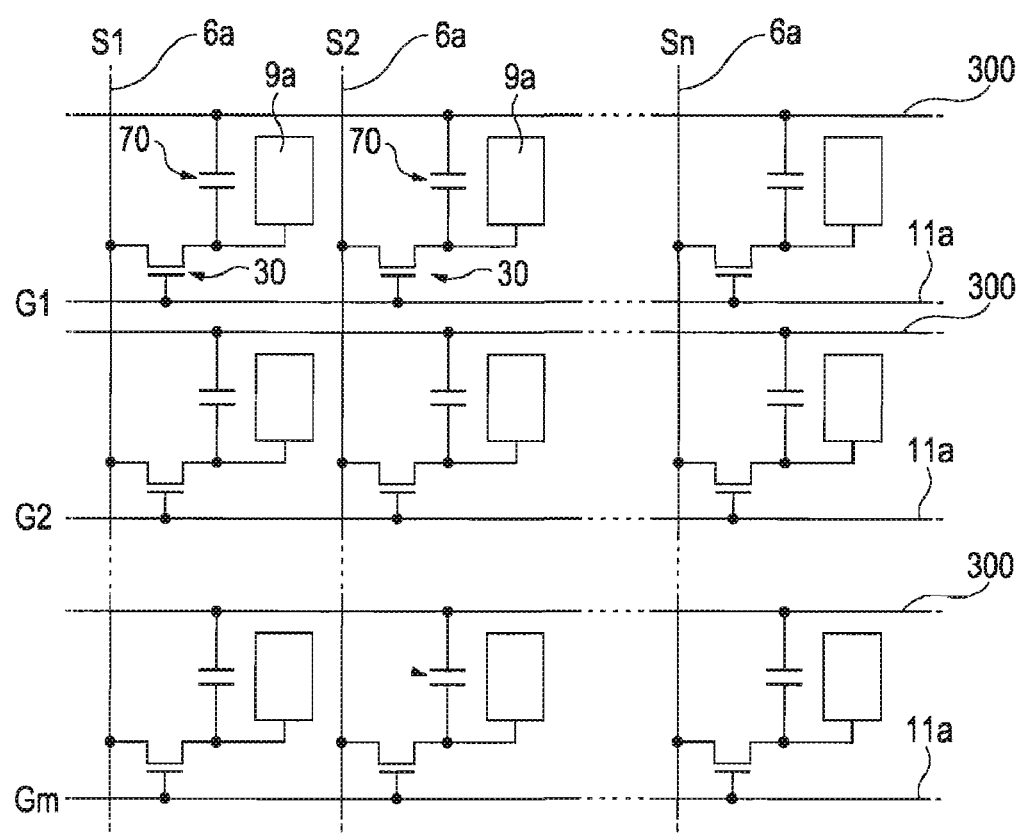
FIG. 2 is an equivalent circuit of the pixel region of the liquid crystal display device, showing elements and wires of some of the pixels defining the pixel region.

FIG. 2 is an equivalent circuit of the pixels defining a pixel region of the liquid crystal display device 100a and shows some of the pixels, including elements and wires. As shown in this figure, the pixel region is provided with a plurality of scanning lines 11a and a plurality of data lines 6a so as to be intersected with each other. Pixel electrodes 9a are formed in a matrix manner in regions surrounded by the scanning lines 11a and the data lines 6a. TFT elements 30 are disposed corresponding to the intersections of the scanning lines 11a and the data lines 6a and each TFT element is connected to the corresponding pixel electrode 9a.

The TFT elements 30 are turned on according an ON signal of scanning signals G1 to Gm from the scanning lines 11a, and image signals S1 to Sn delivered to the data lines 6a at this time are transmitted to the pixel electrodes 9a. A voltage between the pixel electrode 9a and an opposing electrode 21 (see FIG. 3) formed on the opposing substrate 20a is applied to the liquid crystal layer 50. Storage capacitors 70 are each disposed in parallel with the corresponding pixel electrode 9a. The storage capacitor 70 allows the voltage of the pixel electrode 9a to be held for a time period, for example, several thousand times longer than the time period for which a source voltage is applied. The storage capacitor 70 thus enhances the ability of holding voltage to increase the contrast ratio of display.

Figure 3:
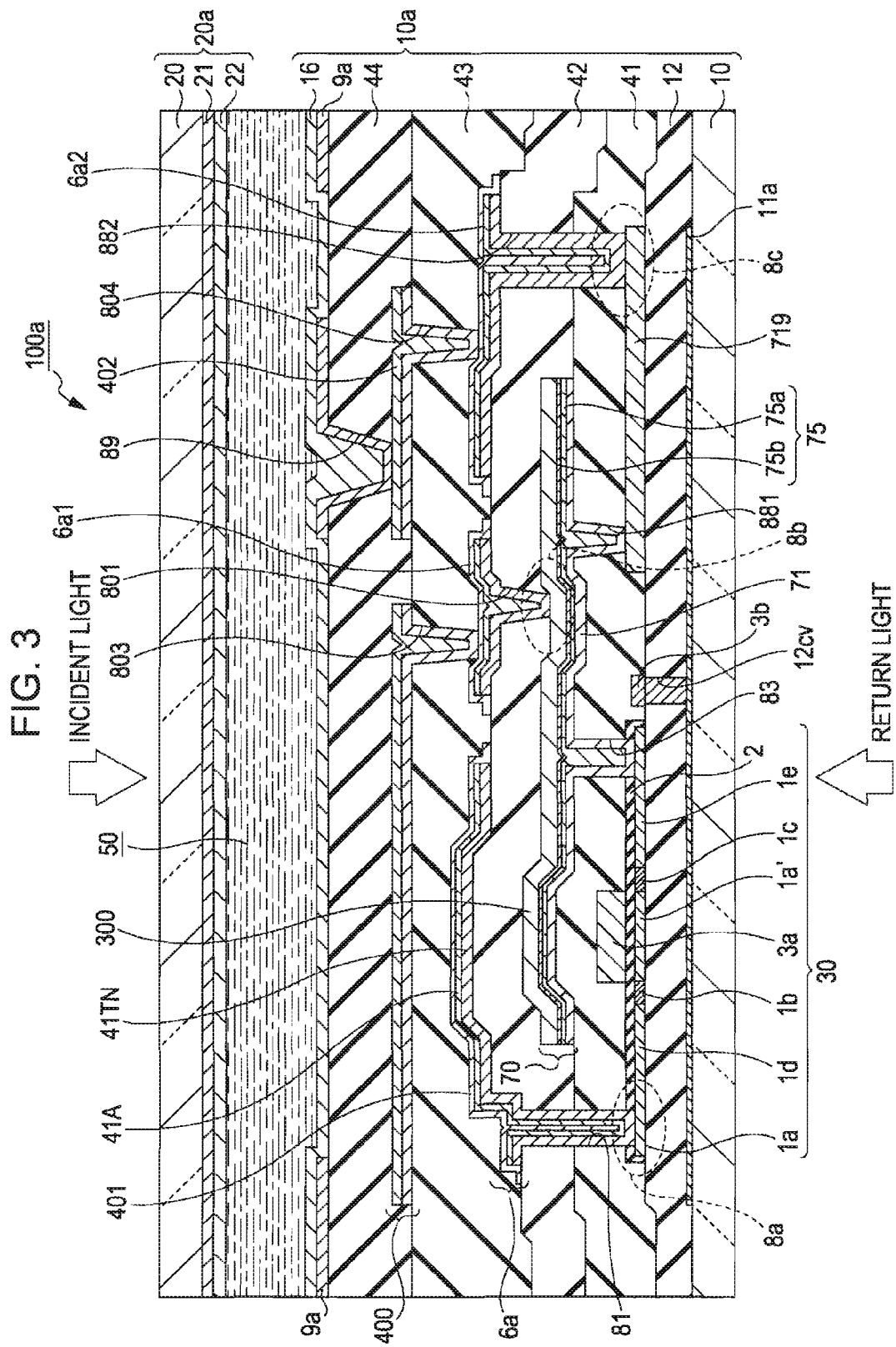
FIG. 3 is a sectional view of the detailed pixel structure of a liquid crystal display device according to a first embodiment of the invention.
Figure 4:
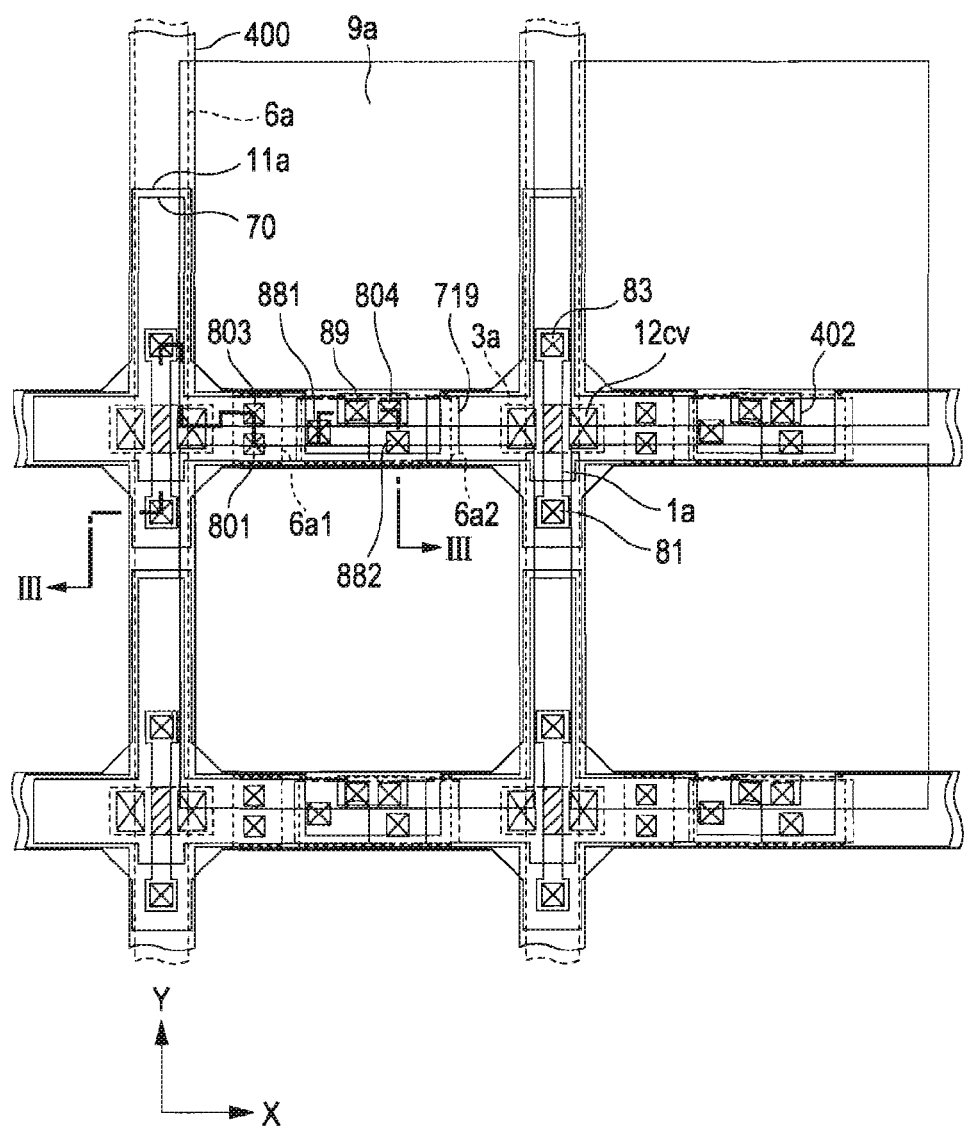
FIG. 4 is a plan view of a pattern of layers formed in adjacent pixels in a TFT substrate.
Figure 5:
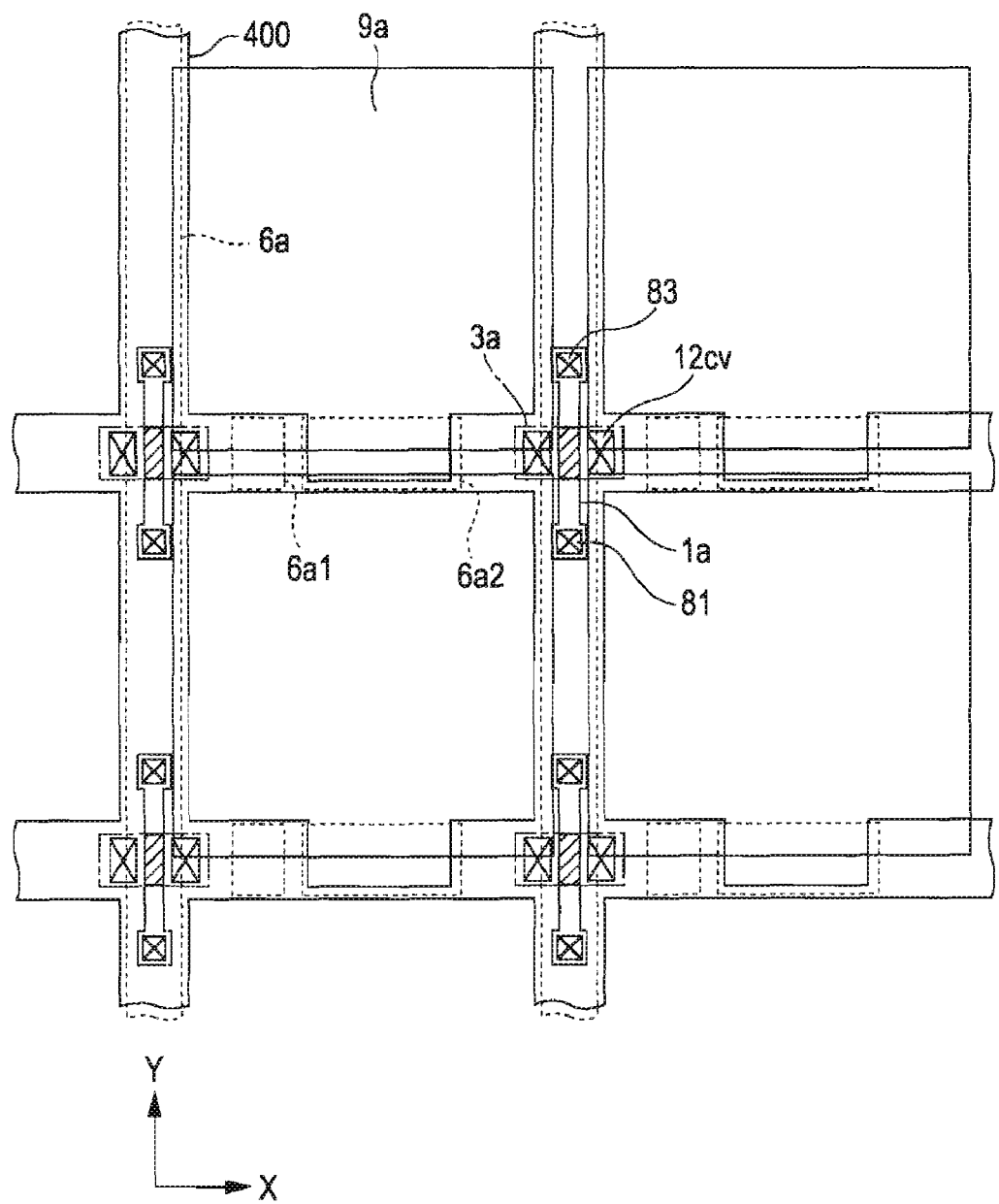
FIG. 5 is a plan view of a pattern of principal parts shown in FIG. 4.

FIG. 3 is a sectional view of the detailed pixel structure of the liquid crystal display device 100a. FIG. 4 is a plan view of a pattern of layers formed in adjacent pixels of a TFT substrate 10a. FIG. 3 corresponds to the section taken along line III-III of FIG. 4. FIG. 5 is a plan view of a pattern of principal parts shown in FIG. 4.

In FIG. 4, the pixel electrodes 9a are arranged in a matrix manner on the TFT substrate 10a. The data lines 6a and the scanning lines 11a extend along the longitudinal and lateral boundaries between the pixel electrodes 9a.

As shown in FIG. 3, a plurality of layers including components are stacked to form the TFT substrate 10a. This multilayer structure includes a first layer including the scan in a lines 11a, a second layer including the TFT elements 30, a third layer including the storage capacitors 70; a fourth layer including the data lines 6a, a fifth layer including the shield layers 400, and a sixth layer including the pixel electrodes 9a and the alignment layers 16 in that order from below. The first layer and the second layer are separated by a base insulating layer 12. The second layer and the third layer are separated by a first insulating inter layer 41. The third layer and the fourth layer are separated by a second insulating interlayer 42. The fourth layer and the fifth layer are separated by a third insulating interlayer 43. The fifth layer and the sixth layer are separated by a fourth insulating interlayer 44. These insulating layers 12, 41, 42, 43, and 44 prevent short-circuiting between the first to sixth layers, and have contact holes including a contact hole 81 electrically connecting a heavily doped source region 1d in the semiconductor layer 1a of the TFT element 30 to the data line 6a. Components in the multilayer structure will now be described.

The first layer includes the scanning lines 11a made of an elemental metal, an alloy, a metal silicide or a polysilicide containing at least one refractory metal, such as Ti (titanium), Cr Chromium), W (tungsten), Ta (tantalum), or Mo (molybdenum), or a multilayer composite of these materials or an electroconductive polysilicon. The scanning lines 11a are patterned into a striped manner along the X direction shown in FIG. 4 when viewed from above. In more detail, the striped scanning lines 11a each include a main line portion extending in the X direction and a protrusion protruding in the Y direction shown in FIG. 4 from which the data line 6a or a shield layer 400 seems to extend when viewed from above. The protrusions of the adjacent scanning lines 11a are not connected to each other; hence, the scanning lines 11a are separate from each other.

Thus, each scanning line 11a functions to simultaneously control the on/off switching of the TFT elements 30 overlying the scanning line. The scanning lines 11a substantially fill the regions other than the pixel electrodes 9a, consequently blocking light coming into the TFT elements 30 from below. Thus, the occurrence of photo-leakage current is prevented in the semiconductor layers 1a of the TFT elements 30, so that high-quality images can be displayed without flicker or the like.

The second layer includes the TFT elements 30 each having a gate electrode 3a. The TFT element 30 has a LDD (lightly doped drain) structure. The TFT element 30 includes the gate electrode 3a and a semiconductor layer 1a. The semiconductor layer 1a includes a channel region 1a' forming a channel with an electric field from the gate electrode 3a, a lightly doped source region 1b, a lightly doped drain region 1c, a heavily doped source region 1d, and a heavily doped drain region 1e. These regions of the semiconductor layer are made of, for example, polysilicon (corresponding to a silicon layer). The TFT element 30 also has an insulating layer 2 including a gate insulating layer isolating the gate electrode 3a from the semiconductor layer 1a.

The second layer also includes relay electrodes 719, each formed in the same film with the gate electrode 3a. The relay electrode 719 is disposed in an island manner so as to be disposed in substantially the middle of a side of the pixel electrode 9a when viewed from above, as shown in FIG. 4.

Since the relay electrode 719 and the gate electrode 3a are formed in the same film, if the gate electrode is formed of a conductive polysilicon film, the relay electrode 719 is formed of the conductive polysilicon film as well.

The base insulating layer 12 made of, for example, silicon oxide is disposed between the scanning lines 11a and the TFT elements 30. The base insulating layer 12 has grooves (contact holes) 12cv at both sides of the semiconductor layer 1a when viewed from above. Each groove has a width as large as the length of the channel of the semiconductor layer 1a extending along the data line 6a. The gate electrode 3a, which is formed over the grooves, has a recess downward corresponding to the grooves 12cv. Thus, the gate electrode 3a is formed so as to fill the grooves 12cv, thereby forming side walls 3b integrally with the grooves. Consequently, the gate electrode 3a overlaps the semiconductor layer 1a of the TFT element 30 across when viewed from above, as shown in FIG. 4. Thus, light cannot enter at least through the overlap.

The side walls 3b, which fill the grooves 12cv, are in contact with the scanning line 11a at the bottoms of the grooves 12cv. Hence, the scanning line 11a, which is formed in a striped manner, always has the same potential as the gate electrode 3a in the same line.

The third layer includes storage capacitors 70. Each storage capacitor 70 includes a lower electrode 71 connected to the heavily doped drain region 1e of the TFT element 30 and the pixel electrode 9a to act as a pixel potential capacitor electrode and an upper electrode (capacitor electrode) 300 acting as a fixed potential capacitor electrode opposing the lower electrode 71 with a dielectric film 75 therebetween. The storage capacitors 70 are disposed so as not to spread over light-transmissive regions substantially corresponding to the regions where the pixel electrodes 9a are formed, as shown in the plan view FIG. 4. In other words, the storage capacitors 70 are formed within light-shielding regions. Consequently, the total pixel aperture ratio of an electro-optic device can be kept relatively high, and thus, bright images can be displayed.

More specifically, the lower electrode 71 is made of, for example, electroconductive polysilicon and functions as a pixel potential capacitor electrode. The lower electrode 71 may be composed of a single layer or a plurality of layers, containing a metal or an alloy. The lower electrode 71 functions to connect the pixel electrode 9a to the heavily doped drain region 1e of the TFT element 30 as well as functioning as the pixel potential capacitor electrode. This connection is established through a relay electrode 719, as described below.

The capacitor electrode 300 functions as a fixed potential capacitor electrode of the storage capacitor 70. The capacitor electrode 300 is connected to a shield layer 400 set at a fixed potential so that the potential of the capacitor electrode can be fixed.

The capacitor electrode 300 is made of, for example, electroconductive polysilicon, in an island manner corresponding to the pixel on the substrate. The capacitor electrode 300 is formed into substantially the same shape as the lower electrode 71. Consequently, the storage capacitor 70 can exhibit high capacitance as much as possible without unnecessarily increasing the area and hence reducing the pixel aperture ratio.

The dielectric film 75 is made of an HTO (high temperature oxide), an LTO (low temperature oxide) such as silicon oxide, or silicon nitride to a relatively small thickness of, for example, about 5 to 200 nm. It is preferable that the dielectric film 75 has a small thickness as long as ensuring reliability, from the viewpoint of increasing the storage capacitance. The dielectric film 75 of the present embodiment has a double layer structure composed of a silicon oxide lower layer 75a and a silicon nitride upper layer 75b.

The first insulating interlayer 41 is formed of, for example, NSG (non-silicate glass), silicate glass such as PSG (phosphorus silicate glass), BSG (boron silicate glass) or BPSG (boron phosphorus silicate glass), silicon nitride, or silicon oxide between the second layer including the TFT elements 30, the gate electrodes 3a and the relay electrodes 719 and the third layer including the storage capacitors 70. Preferably, the first insulating interlayer 41 is made of NSG. The first insulating Interlayer 41 has contact holes 81 passing through the below-described second insulating interlayer 42. Each contact hole 81 electrically connects the heavily doped source region 1d of the corresponding TFT element 30 to the data line 6a. The first insulating interlayer 41 also has contact holes 83 for electrically connecting the heavily doped drain region 1e of the TFT element 30 to the lower electrode 71 of the storage capacitor 70.

The first insulating Interlayer 41 further has contact holes 881 for electrically connecting the pixel potential capacitor electrode or lower electrode 71 of the storage capacitor 70 to the relay electrode 719. The first insulating interlayer 41 still further has contact holes 882 for electrically connecting the relay electrode 719 to a second relay electrode 6a2, passing through the below-described second insulating interlayer 42.

The second insulating interlayer 42 is formed of, for example, silicon oxide between the third layer and the fourth layer on the first insulating interlayer 41. The second insulating interlayer 42 has contact holes 81, each formed for electrically connecting the heavily doped source region 1d of the TFT element 30 to the data line 6a, and other contact holes 801, each formed for electrically connecting a shield layer relay electrode 6a1 to the capacitor electrode 300 of the storage capacitor 70. The second insulating interlayer 42 further has contact holes 882, each formed for electrically connecting a second relay electrode 6a2 to the relay electrode 719.

The fourth layer includes the data lines 6a. The data lines 6a extend in the direction in which the semiconductor layer 1a of the TFT element 30 extends, and are thus formed in a striped manner in the Y direction shown in FIG. 4. Each data line 6a includes, from below, a titanium composite layer 41TN made of titanium and titanium nitride deposited in that order, an aluminum layer 41A, and a titanium nitride layer 401, as shown in FIG. 3. The titanium nitride layer 401 is patterned larger so as to cover the underlying aluminum layer 41A and titanium composite layer 41TN.

Figure 11A:
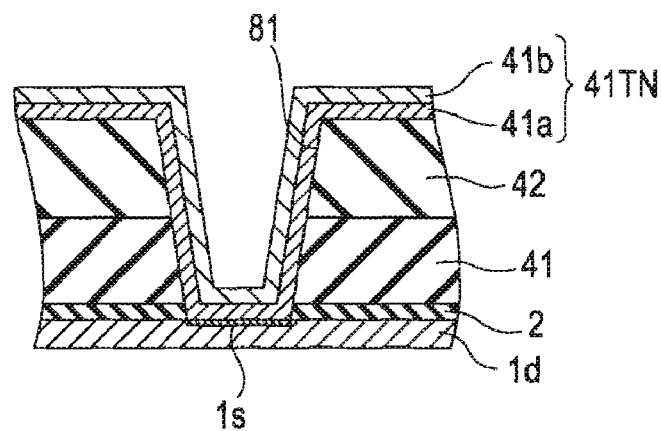
FIGS. 11A to 11C are sectional views showing the details of the manufacturing process of the TFT substrate and the liquid crystal display device.

The data line 6a is electrically connected to the heavily doped source region 1d of the TFT element 30 at connection point 8a shown in FIG. 3 through the contact hole 81. FIG. 11C is an enlarged sectional view of this point. As shown in this figure, the data line 6a has the multilayer structure including the titanium composite layer 41TN, the aluminum layer 41A, and the titanium nitride layer 401 in the contact hole 81 as well. The titanium composite layer 41TN is formed by deposing a titanium layer 41a and a titanium nitride layer 41b in that order; hence, the data line 6a is in contact with the heavily doped source region 1d using the titanium layer 41a of the titanium composite layer 41TN.

The portion of the heavily doped source region 1d in contact with the titanium layer 41a is silicided. For example, in the present embodiment, the portion of the heavily doped source region 1d in contact with the titanium layer 41a is turned into a titanium silicide ($Ti_5Si_3$) layer 1s. Consequently, the contact point of the heavily doped source region 1d and the data line 6a has a multilayer structure of polysilicon (heavily doped source region 1d)/titanium silicide/titanium.

The structure having the titanium silicide layer between the polysilicon layer and the titanium aver establishes an ohmic contact with a low resistance at the connection point. Thus, sufficient electroconductivity can be ensured even if the area of the connection point is reduced according to the miniaturization of the TFT element 30. The heavily doped source region 1d corresponds to a silicon layer of the invention.

Turning back to FIG. 3, the fourth layer further includes the shield layer relay electrode 6a1 and second relay electrode 6a2 in the same film with the data line 6a. As shown in FIG. 4, the shield layer relay electrode 6a1 and second relay electrodes 6a2 are patterned such that they do not continue to the data line 6a, but are separate from each other. More specifically, in FIG. 5, the shield layer relay electrode 6a1 in substantially a rectangular shape is disposed to the right of the data line 6a located at the felt of the figure, and the second relay electrode 6a2, which has a larger area than the shield layer relay electrode 6a1, is disposed to the right of the shield layer relay electrode 6a1. The shield layer relay electrode 6a1 and the second relay electrode 6a2 are formed with the data line 6a in the same step in a multilayer structure including the titanium composite layer 41TN of the titanium layer 41a and the titanium nitride layer 41b, the aluminum layer 41A, and the titanium nitride layer 401 from below. The titanium nitride layer 401 is patterned to a rather large area so as to cover the underlying aluminum layer 41A and titanium composite layer 41TN. The titanium nitride layer 41TN functions as a barrier metal that prevents the contact holes 803 and 804 from passing through the shield layer relay electrode 6a1 and the second relay electrode 6a2.

The connection point 8b of the shield layer relay electrode 6a1 and the capacitor electrode 300 and the connection point 8c of the second relay electrode 6a2 and the relay electrode 719 have the same polysilicon/titanium silicide/titanium multilayer structure as the connection point 8a. Specifically, the capacitor electrode 300 and the second relay electrode 6a2 are made of polysilicon, and titanium silicide layers 1s are formed at the portion of the capacitor electrode 300 in contact with the shield layer relay electrode 6a1 and the portion of the relay electrode 719 in contact with the second relay electrode 6a2 in the same manner as at the connection point 8a (see FIG. 11C). The structure having the titanium silicide layer 1s between the polysilicon layer and the titanium layer establishes an ohmic contact with a low resistance at the connection points 8b and 8c. Thus, sufficient conductivity can be ensured even if the area of the connection point is reduced to increase the aperture ratio. The capacitor electrode 300 and the relay electrode 719 correspond to a silicon layer of the invention.

The data line 6a, the shield layer relay electrode 6a1, and the second relay electrode 6a2 each have a titanium layer 41a as their lowermost layers (at the TFT element 30 side). The titanium layer 41a exhibits high ability to absorb light, and has a lower reflectance than the aluminum layer 41A having particularly high reflectance. The titanium layer 41a is formed so as to cover the entire surface of the base 10 side (TFT element 30 side) of the aluminum layer 41A. Consequently, the reflection of light coming through the base 10 (for example, return light in FIG. 3) can be prevented, so that the photo-leakage current from the TFT element 30, which is generated by the reflected light, can be reduced. Thus, high-quality display can be achieved without flicker, nonuniformity, or other problems. The titanium layer 41a corresponds to a first metal layer and the aluminum layer 41A corresponds to a second metal layer, in the invention.

The fifth layer includes a shield layer 400. The shield layer 400 is formed in a grid manner in the X and Y directions when viewed from above, as shown in FIGS. 4 and 5. The portions of the shield layer 400 extending in the Y direction have a larger width than the data line 6a and cover the data lines 6a. The portions of the shield layer 400 extending in the X direction have indentations near the middle of a side of each pixel electrode 9a so as to ensure regions for forming below-described third relay electrodes 402.

The shield layer 400 extends outward from the image display region 5 including the pixel electrodes 9a and is electrically connected to a controlled potential source to be set at a fixed potential. The controlled potential source may be a fixed positive or negative power supply to the data line driving circuit 101 or a fixed power supply to the opposing electrode 21 of the opposing substrate 20a.

The presence of the shield layer 400 covering the entire data lines 6a (see FIG. 5) with a fixed potential can eliminate the effect of capacitance coupling occurring between the data lines 6a and the pixel electrodes 9a. The shield layer 400, which is formed in a grid manner, can also prevent unnecessary capacitance coupling in the regions where the scanning lines 11a extend.

The fourth layer further Includes third relay electrodes 402, made of the same film as the shield layer 400. The third relay electrode 402 relays the electrical connection between the second relay electrode 6a2 and the pixel electrode 9a through a below-described contact hole 89. The shield layer 400 and the third relay electrode 402 are patterned such that they do not continue to each other, but are separate from each other.

The shield layer 400 and the third relay electrodes 402 have a double-layer structure including an aluminum underlayer and a titanium nitride layer. The aluminum underlayer of the third relay electrode 402 is connected to the second relay electrode 6a2, and its upper layer, or the titanium nitride layer, is connected to the pixel electrode 9a, which may be made of ITO.

Since the shield layer 400 and the third relay electrode 402 contain relatively light-reflective aluminum and relatively light-absorbing titanium nitride, they can function as a light-shielding layer. Thus, the shield layer 400 and the third relay electrode 402 can block light coming into the semiconductor layer 1a of the TFT element 30 (see FIG. 3) at the upper side of the TFT element. The above-described capacitor electrode 300 and the data line 6a also have such light-shielding ability. The shield layer 400, the third relay electrode 402, the capacitor electrode 300, and the data line 6a serve as upper light-shielding films blocking light coming from above to the TFT element 30, constituting the multilayer structure defining the TFT substrate 10a.

A third insulating Interlayer 43 is formed of, for example, silicon oxide between the data lines 6a and the shield layer 400. The third insulating interlayer 43 has contact holes 803 each formed for electrically connecting the shield layer 400 and the corresponding shield layer relay electrode 6a1, and contact holes 804 each formed for electrically connecting the corresponding third relay electrode 402 and second relay electrode 6a2.

The sixth layer includes the pixel electrodes 9a arranged in a matrix manner as described above, and an alignment layer 16 is formed over the pixel electrodes 9a. A fourth insulating Interlayer 44 made of, for example, silicon oxide is disposed under the pixel electrodes 9a. The fourth insulating interlayer 44 has contact holes 89 each formed for electrically connecting the pixel electrode 9a and the third relay electrode 402.

The opposing substrate 20a includes a base 20, and an opposing electrode 21 and a polyimide-based alignment layer 22 on the base 20. The opposing electrode 21 is made of a transparent material, such as ITO. The alignment layers 16 and 22 are subjected to rubbing so that the liquid crystal molecules of the liquid crystal layer 50 are aligned at a predetermined pretilt angle.

B: Manufacturing Method

Figure 8:
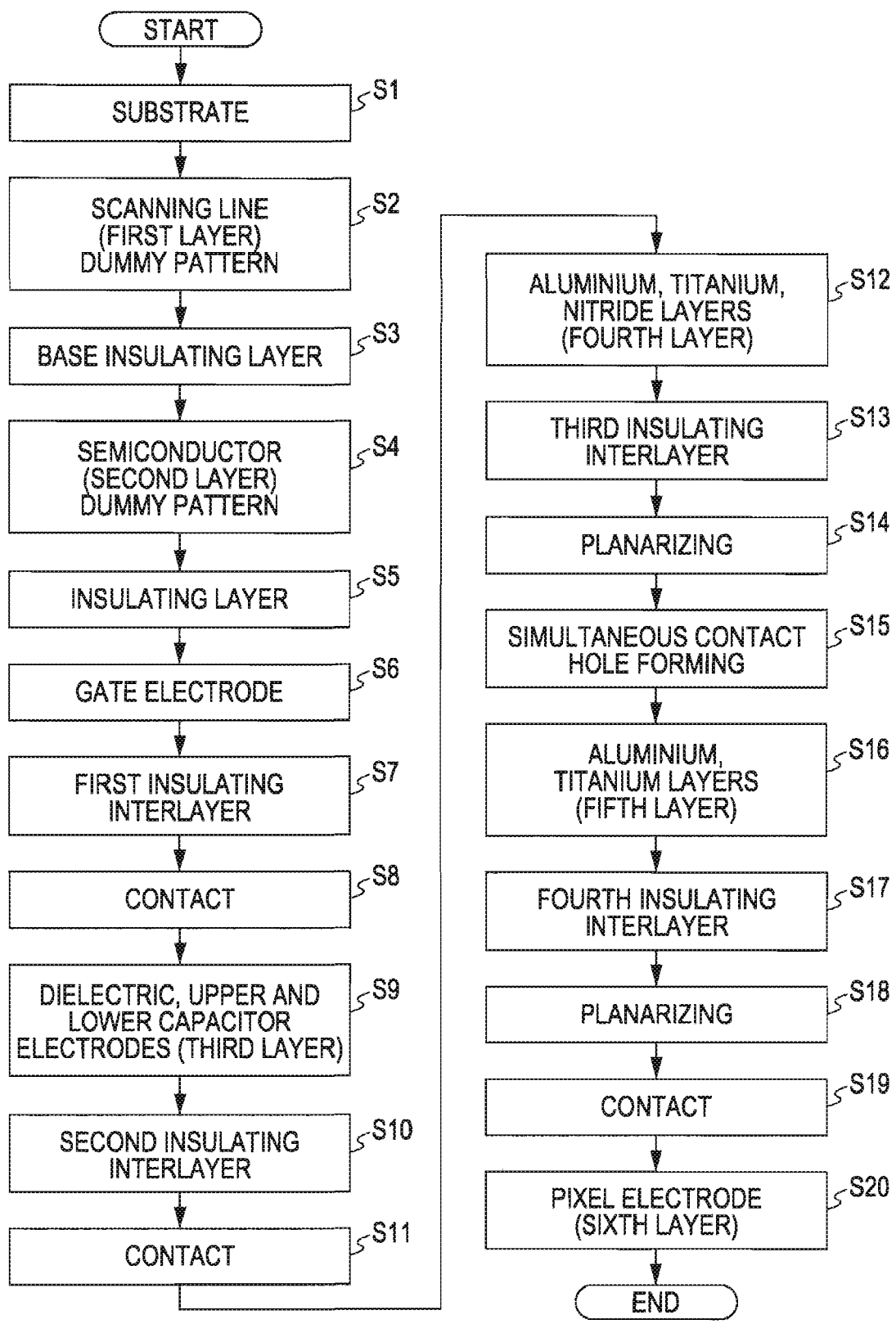
FIG. 8 is a flow chart of the manufacturing process of the TFT substrate and the liquid crystal display device.
Figure 9:
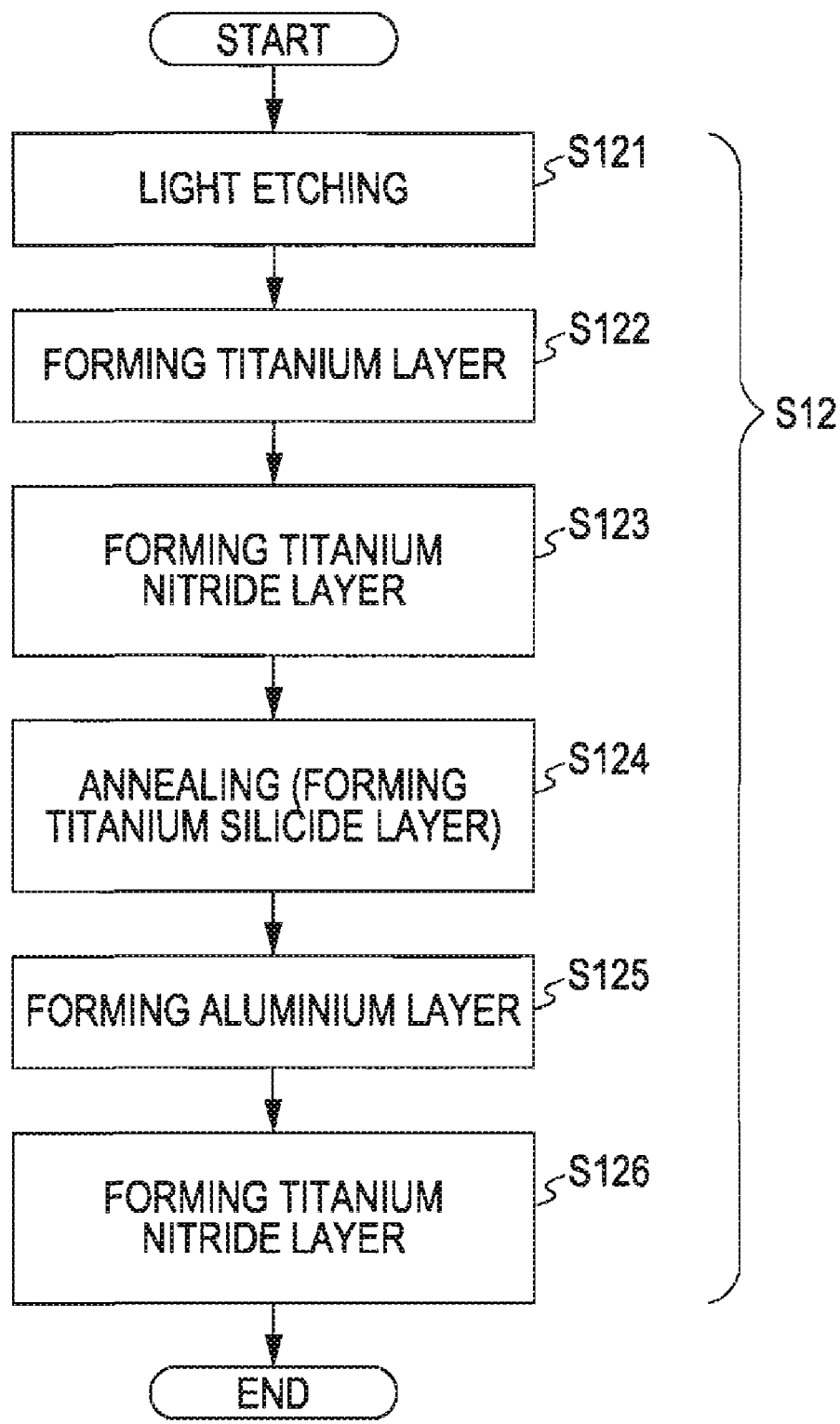
FIG. 9 is a flow chart of the manufacturing process of the TFT substrate and the liquid crystal display device.

A method for manufacturing the liquid crystal display device 100a according to the present embodiment and the TFT substrate 10a of liquid crystal display device 100a will now be described with reference to FIGS. 5A to 11C. FIGS. 6A to 6E and 7A to 7D are sectional views showing a manufacturing process of the TFT substrate 10a and the liquid crystal display device 10a in order of steps. FIG. 8 is a flow chart of the manufacturing process of the TFT substrate 10a and the liquid crystal display device 100a. FIG. 9 is a flow chart illustrating step S12 in the manufacturing process shown in FIG. 8 in detail. FIGS. 10A to 10D and 11A to 11C are sectional views showing step S12 in detail in order of steps. The following description proceeds along the steps shown in FIG. 8.

First, in step S1, the base 10 made of quartz, glass, silicon, or the like is prepared.

Then, in step S2, a metal alloy film of Ti, Cr, W, Ta, Mo, or a metal silicide is deposited over the entire surface of the base 10 by sputtering. Such a layer or film before patterning is hereinafter referred to as a precursor film. The metal alloy precursor film is patterned into scanning lines 11a in a striped manner in plan view by photolithography and etching.

Then, in step S3, the base insulating layer 12 is formed of silicate glass, silicon nitride, silicon oxide or the like over the scanning lines 11a by, for example, normal-pressure or low-pressure CVD.

Figure 6A:
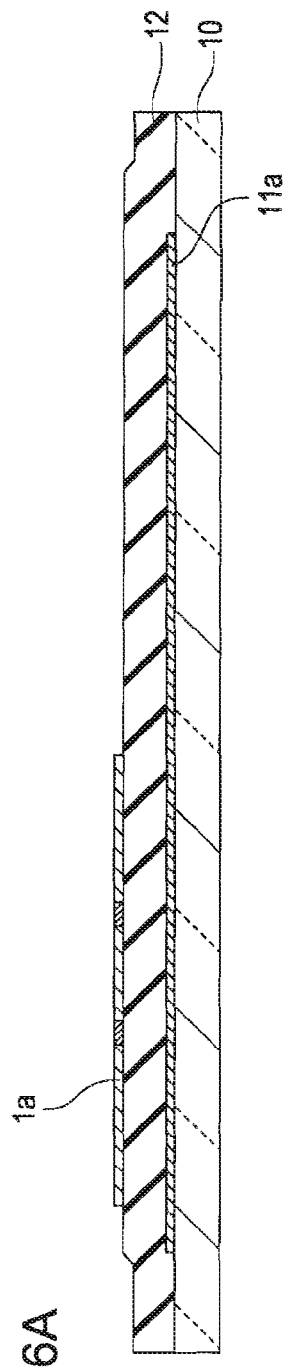
Figure 6B:
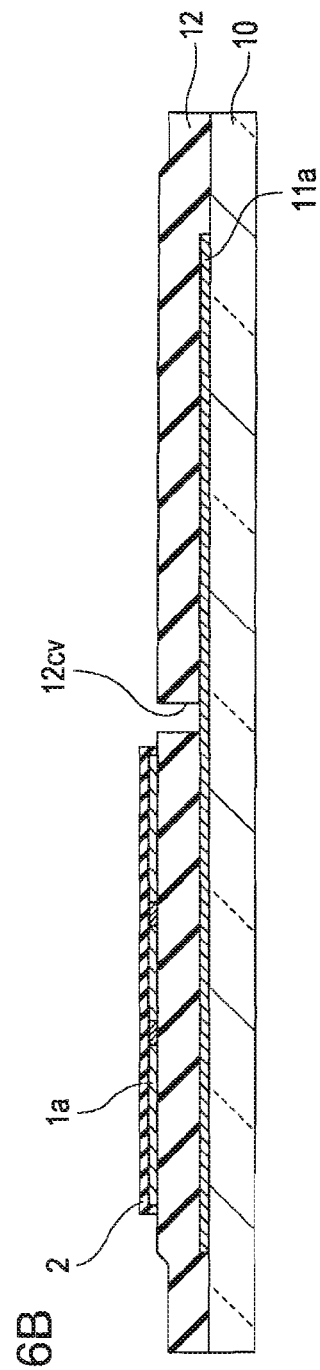

In step S4, the semiconductor layer 1a is formed in the second layer. The precursor film of the semiconductor layer 1a is an amorphous silicon film formed on the base insulating layer 12 by low-pressure CVD or the like. Subsequently, the precursor film is subjected to annealing in a nitrogen atmosphere to grow p-Si (polysilicon) from the solid phase to a thickness of about 50 to 200 nm, preferably about 100 nm. At this point, the precursor film may be doped with a dopant, such as an element of the V group or the III group, by ion implantation depending on whether the TFT element 30 is an n type or p type. Then, the precursor film is patterned into the semiconductor layer 1a with a predetermined shape by photolithography and etching (FIG. 6A).

Then, in step S5, the semiconductor layer 1a of the TFT element 30 is thermally oxidized to form an underlying gate insulating layer, and is, in some cases, subsequently subjected to low-pressure CVD or the like to form an overlying gate insulating layer. Thus, the insulating film 2 of a single-layer or multilayer high temperature silicon oxide film (HTO film) or silicon nitride film is formed (including the gate insulating layer) (see FIG. 6B). In order to control the threshold voltage Vth of the TFT element 30, the n channel region or p channel region of the semiconductor layer 1a is doped with a predetermined amount of dopant, such as boron, by ion implantation or the like. Then, the grooves 12cv communicating with the scanning lines 11a are formed in the base insulating layer 12 by dry etching, such as reactive ion etching or reactive ion beam etching.

Figure 6C:
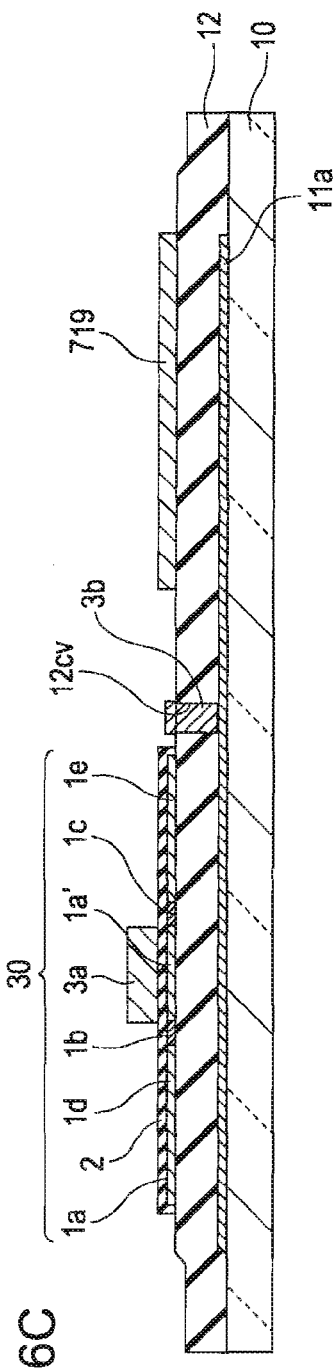

Then, in step S6, the gate electrode 3a and the relay electrode 719 are formed (FIG. 6C). Specifically, a polysilicon film is deposited by low-pressure CVD or the like, and phosphorus (P) is thermally diffused into the polysilicon film to make the polysilicon film electroconductive. The polysilicon film is then patterned into the gate electrode 3a with a predetermined shape by photolithography and etching. The side walls 3b extending from the gate electrode 3b are formed simultaneously with the formation of the gate electrode 3a. The relay electrode 719 is also formed simultaneously.

Then, the lightly doped source region 1b, lightly doped drain region 1c, heavily doped source region 1d and heavily doped drain region 1e are formed in the semiconductor layer 1a. In the present embodiment, it is supposed that the TFT element 30 is an n-channel TFT having an LDD structure. More specifically, for forming the lightly doped source region 1b and the lightly doped drain region 1c, the semiconductor layer 1a is doped with an element of the V group, such as P, using the gate electrode 3a as a mask. Consequently, the region of the semiconductor layer 1a under the gate electrode 3a becomes a channel region 1a'. For forming the heavily doped source region 1d and the heavily doped drain region 1e, a resist layer having a wider pattern than the width of the gate electrode 3a is formed on the gate electrode 3a. Then, the semiconductor layer is doped with an element of the V group, such as P, at a high concentration. Thus, the TFT element 30 is completed. The sequence of steps S4 to S6 corresponds to the step of forming the TFT element 30 in the invention.

Then, in step 7, the first insulating interlayer 41 is formed of silicate glass, silicon nitride, or silicon oxide on the gate electrode 3a by, for example, normal-pressure or low-pressure CVD.

In step S8, the first insulating interlayer 41 is subjected to dry etching, such as reactive ion etching or reactive ion beam etching, to form the contact holes 83 and 881 (FIG. 6D).

Turning to step S9, the storage capacitor 70 including the lower electrode 71, the dielectric film 75, and the capacitor electrode 300 is formed (FIG. 6E). Specifically, a metal, such as Pt, or polysilicon is deposited on the first insulating interlayer 41 to form a precursor film of the lower electrode 71 by low-pressure CVD or sputtering. Then, a precursor film of the dielectric film 75 is formed on the lower electrode 71. The dielectric film 75 can be formed by various known techniques for generally forming a TFT gate insulating layer, as in the formation of the insulating film 2. Then, polysilicon is deposited on the dielectric film 75 by low-pressure CVD or sputtering to form a precursor film of the capacitor electrode 300. Then, the precursor films of the lower electrode 71, the dielectric film 75, and the capacitor electrode 300 are simultaneously patterned into the lower electrode 71, the dielectric film 75, and the capacitor electrode 300, and thus the storage capacitor 70 is completed (FIG. 7A).

Tuning to step S10, the second insulating interlayer 42 is formed of silicate glass, silicon nitride, silicon oxide, or the like by normal-pressure or low-pressure CVD or the like.

Figure 10A:
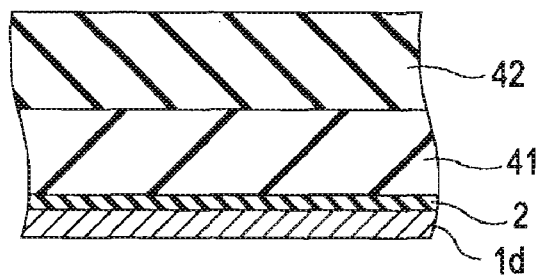
FIGS. 10A to 10D are sectional views showing the details of the manufacturing process of the TFT substrate and the liquid crystal display device.
Figure 10B:
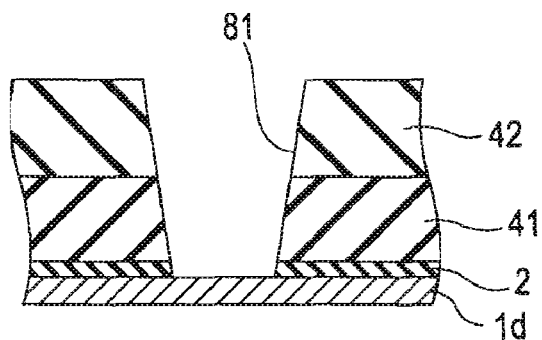

Then, in step S11, the second insulating interlayer 42 is subjected to dry etching, such as reactive ion etching or reactive ion beam etching, to form the contact holes 81, 801, and 882 (FIG. 7B). In this instance, the contact hole 81 is formed so as to communicate with the heavily doped source region 1d of the semiconductor layer 1a; the contact hole 801, with the capacitor electrode 300; and the contact hole 882, with the relay electrode 719. FIGS. 10A and 10B show the heavily doped source region 1d before and after step S11.

Figure 7C:
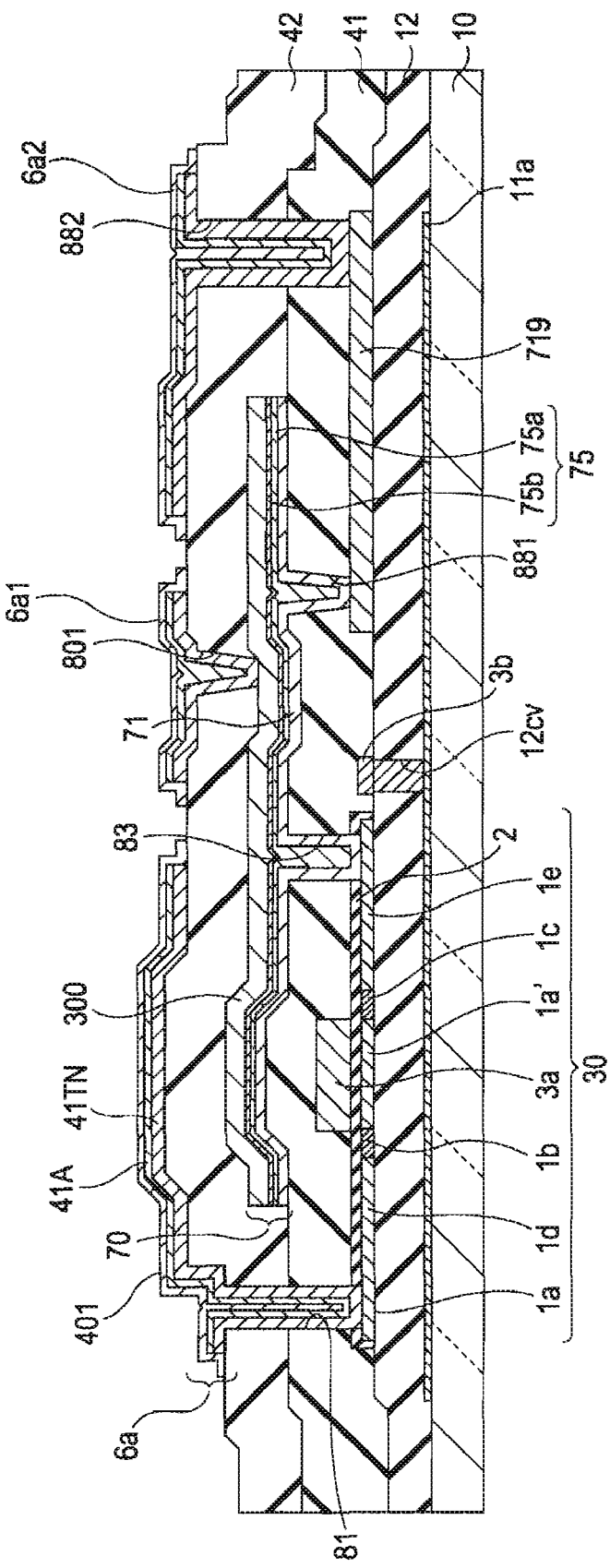
Figure 7D:
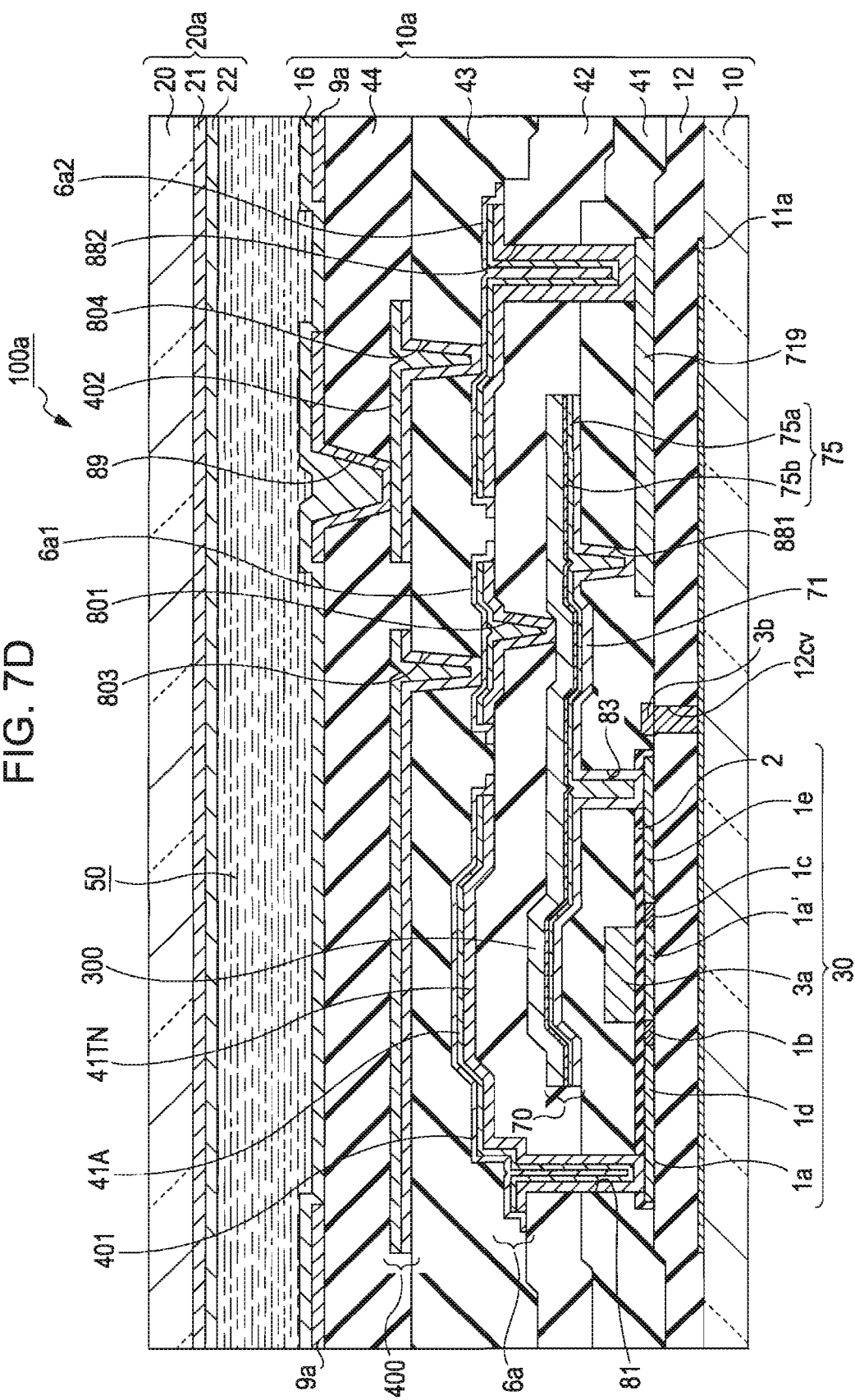

Turning to step S12, titanium, aluminum, titanium nitride, or the like is deposited to form the data line 6a, the shield layer relay electrode 6a1, and the second relay electrode 6a2 (FIG. 7C). Step S12 includes sub steps S121 to S126 shown in FIG. 9. These steps will now be described along the flow chart shown in FIG. 9.

In sub step S121, native oxide (surface oxide film) or deposited foreign matter is removed from the surface of the polysilicon heavily doped source region 1d, capacitor electrode 300 and relay electrode 719 by light etching (wet etching) using hydrofluoric acid. Consequently, the contact resistance of these components with the later formed data line 6a, shield layer relay electrode 6a1, and second relay electrode 6a2 can be reduced. This sub step can be performed by etching other than light etching.

Figure 10C:
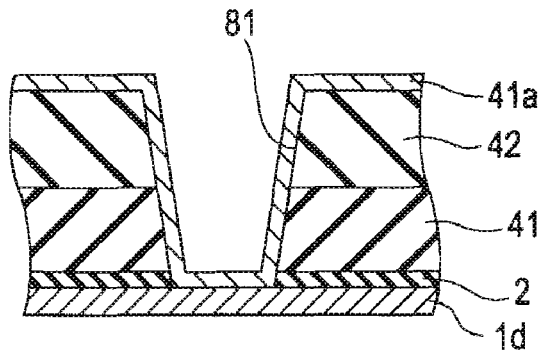

Turning to sub step S122, the titanium layer 41a is formed over the entire surface of the second insulating interlayer 42 by, for example, sputtering in a vacuum chamber (FIG. 10C). This figure shows only the heavily doped source region 1d and its vicinity. The same applies to other figures of FIGS. 10A to 11C. The titanium layer 41a is formed so as to extend to the inner walls and bottoms of the contact holes 81, 801, and 882, consequently coming into contact with the heavily doped source region 1d, the capacitor electrode 300, and the relay electrode 719. The titanium layer 41a is preferably has a thickness of about 20 nm. Before sputtering, preferably, the inside of the vacuum chamber is baked. This sub step S122 corresponds to the step of forming a titanium layer in the invention.

Figure 10D:
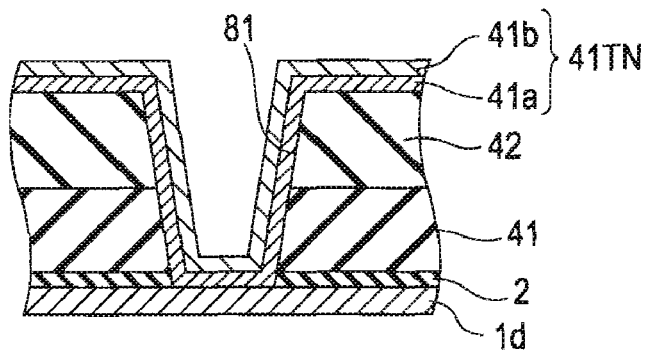

Then, in sub step S123, the titanium nitride layer 41b is formed on the titanium layer 41a by sputtering or the like in the same atmosphere as in sub step S122, that is, in the same chamber under vacuum (FIG. 10D). By forming the titanium layer 41a and the titanium nitride layer 41b in the same atmosphere, the titanium layer 41a is prevented from coming into contact with air and causing oxidization or other reaction. Preferably, the thickness of the titanium nitride layer 41b is about 50 mm and the sputtering is reactive sputtering in an $N_2$ atmosphere. Thus, the titanium composite layer 41TN including the titanium layer 41a and the titanium nitride layer 41b is formed over the heavily doped source region 1d, capacitor electrode 300, and relay electrode 719. This sub step S123 corresponds to the step of forming titanium nitride layer in the invention.

Then, in step S124, annealing is performed in a $H_2$/Ar gas mixture. Consequently, the portions in contact with the titanium layer 41a of the polysilicon heavily doped source region 1d, capacitor electrode 300 and relay electrode 719 are silicided to form a titanium silicide layer is (FIG. 11A). In this instance, annealing is preferably performed in an atmosphere of 300 to 400° C. for about 120 minutes Annealing at a temperature of 300° C. or more can form the titanium silicide layer 1s. Annealing at a temperature of 400° C. or less prevents the titanium silicide layer 1s from becoming uneven. By performing annealing at a temperature in the above range, a satisfying titanium silicide layer is can be formed. Such treatment can silicide the portions in contact with the titanium layer 41a of the polysilicon films (silicon layers). The annealing in this sub step can be performed in other atmospheres, such as a $N_2$ gas atmosphere, instead of using $H_2$/Ar gas mixture.

Figure 11B:
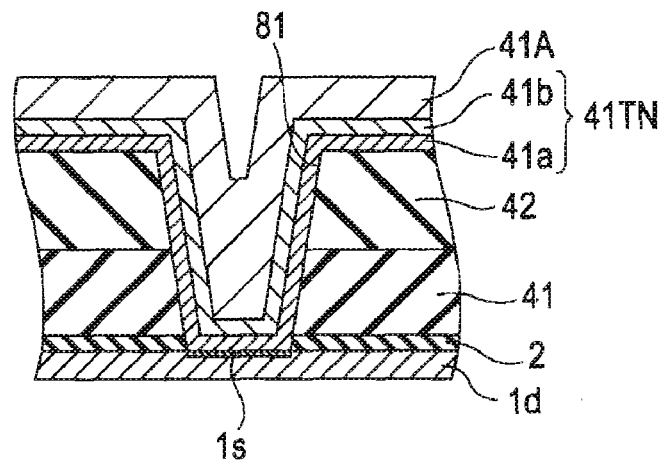
Figure 11C:
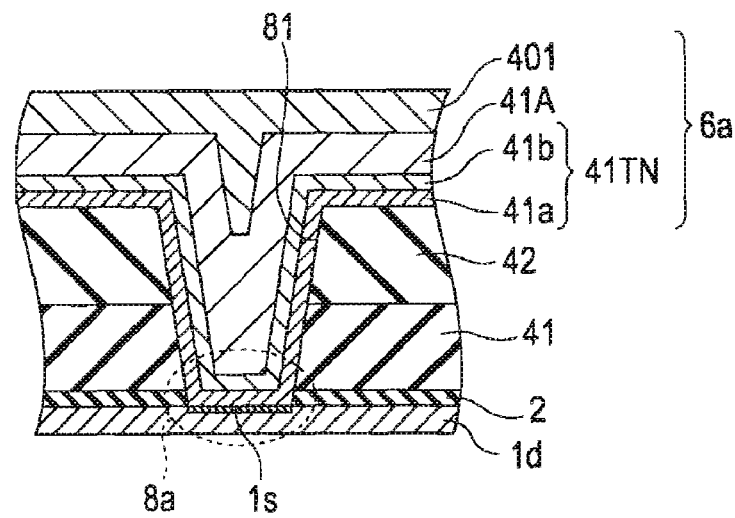

Turning then to sub step S125, the aluminum layer 41A is formed on the titanium nitride layer 41b of the titanium composite layer 41TN by, for example, sputtering (FIG. 11B. The thickness of the aluminum layer 41A is preferably about 350 nm.

Turning then to sub step S126, the titanium nitride layer 401 is formed on the aluminum layer 41A by, for example, sputtering (FIG. 11C). The thickness of the titanium nitride layer 401 is preferably about 150 nm. Then, the titanium composite layer 41TN, the aluminum layer 41A, the titanium nitride layer 401 are simultaneously patterned into a shape defining the data line 6a, the shield layer relay electrode 6a1, the second relay electrode 6a2 by photolithography and etching. Thus, the sequence of step S12 including sub steps S121 to step S126 is completed, thereby completing the connection points 8a, 8b, and 8c having the polysilicon/titanium silicide/titanium multilayer structure (see FIGS. 11C and 3).

Turning back to FIG. 8, in step S13, the third insulating interlayer 43 is formed of silicate glass, silicon nitride, silicon oxide, or the like so as to cover the data lines 6a by, for example, normal-pressure or low-pressure CVD.

Then, in step S14, the third insulating interlayer 43 is planarized by, for example, CMP.

Then, in step S15, the third insulating interlayer 43 is subjected to dry etching, such as reactive ion etching or reactive ion beam etching, to form the contact holes 803 and 804. In this Instance, the contact holes 803 is formed so as to communicate with the shield layer relay electrode 6a1, and the contact hole 804 is formed so as to communicate with the second relay electrode 6a2.

Turning then to step S16, the shield layer 400 of the fifth layer is formed on the third insulating interlayer 43 by, for example, sputtering or plasma CVD. For example, a lower layer is formed of a low-resistance material, such as aluminum, on the third insulating interlayer 43, and subsequently, an upper layer is formed on the lower layer using a material not causing galvanic corrosion with ITO or the pixel electrode 9a, such as titanium nitride. Finally, the lower layer and the upper layer are simultaneously patterned into the double-layer shield layer 400. In this step, the third relay electrode 402 is formed, as well as the shield layer 400.

Then, in step S17, the fourth insulating interlayer 44 is formed of silicate glass, silicon nitride, silicon oxide, or the like in the pixel region by, for example, normal-pressure or low-pressure CVD.

Turning then to step S18, the fourth insulating interlayer 44 is planarized by, for example, CMP.

In step S19, the fourth insulating Interlayer 44 is subjected to dry etching, such as reactive ion etching or reactive ion beam etching to form the contact hole 89. In this instance, the contact hole 89 is formed so as to communicate with the third relay electrode 402.

Then, in step S20, a transparent electroconductive film, such as an ITO film, is deposited to a thickness of about 50 to 200 nm on the fourth insulating interlayer 44 by spattering or the like. The transparent electroconductive film is patterned into the pixel electrode 9a by photolithography and etching. After applying a polyimide coating liquid for the alignment layer onto the pixel electrode 9a, the coating is subjected to rubbing in a predetermined direction so as to have a predetermined pretilt angle. Thus, the alignment layer 16 is formed, and the TFT substrate 20a including the base 10 to the alignment layer 16 is completed. The process including the steps up to here corresponds to the method for manufacturing the electro-optic device substrate of the invention.

For the opposing substrate 20a, a transparent electroconductive film, such as an ITO film, is deposited to form the opposing electrode 21 over the entire surface of the base 20 by sputtering or the like. After applying a polyimide coating liquid for the alignment layer onto the entire surface of the opposing electrode 21, the coating is subjected to rubbing in a predetermined direction so as to have a predetermined pretilt angle. Thus the alignment layer 22 is Formed, and the opposing substrate 20a including the base 20 to the alignment layer 22 is completed.

Finally, as shown in FIGS. 1 and 3, the multilayer TFT substrate 10a and opposing substrate 20a are bonded together. For example, a sealant 52 is applied along the four sides of the opposing substrate 20a and vertical conductors 106 are formed in the four corners of the sealant 52. The alignment layers 16 and 22 are bonded together so as to oppose each other with the sealant 52 therebetween. Then, liquid crystal containing several types of nematic liquid crystal molecules is drawn into the space between the two substrates by vacuum suction or the like to form the liquid crystal layer 50 with a predetermined thickness.

The sealant 52 is, for example, a UV curable resin or thermosetting resin capable of being cured by ultraviolet light or heat so as to bond the two substrates together. The sealant 52 contains a gap material (spacer), such as glass fiber or glass beads, to give a predetermined distance (gap) between the two substrates. The liquid crystal layer 50 may contain such a gap material.

In the above-described embodiment, the data line driving circuit 101 and the scanning line driving circuit 104 may be electrically and mechanically connected to, for example, a driving LSI mounted on a TAB (tape automated bonding) substrate through an anisotropic electroconductive film provided around the TFT substrate 10a, instead of mounting on the TFT substrate. In addition, polarizing films, retardation films, polarizers, or the like are provided at a predetermined direction on the side of the opposing substrate 20a through which light enters and the side of the TFT substrate 10a through which light emits, according to the operational mode, such as TN (twisted nematic) mode, VA (vertically aligned) mode or PDLC (polymer dispersed liquid crystal) mode, or the normal white or normal black mode.

In the resulting liquid crystal display device 100a, the polysilicon layer and the metal wire are connected with the titanium silicide layer is therebetween at the connection point 8a of the heavily doped source region 1d and the data line 6a, the connection point 8b of the capacitor electrode 300 and the shield layer relay electrode 6a1, and the connection point 8c of the relay electrode 719 and the second relay electrode 6a2. Consequently, the contact resistance between the polysilicon layer and the metal wire can be reduced in comparison with the case where the polysilicon is directly connected to the metal wire. In addition, the low-reflectance titanium layer 41a is formed as the lowermost layer (base 10 side) of the data line 6a, shield layer relay electrode 6a1 and second relay electrode 6a2, and thus can prevent light coming through the base 10 from reflecting. Thus, photo-leakage current from the TFT element 30 caused by reflected light can be reduced.

Second Embodiment

A second embodiment of the invention will now be described in which a liquid crystal display device 100b has a different structure from that of the first embodiment. The liquid crystal display device 100b of the present embodiment has a multilayer structure partially different from that of the liquid crystal display device 100a according to the first embodiment. The following description does not illustrate the same components as in the liquid crystal display device 100a of the first embodiment.

Figure 12:
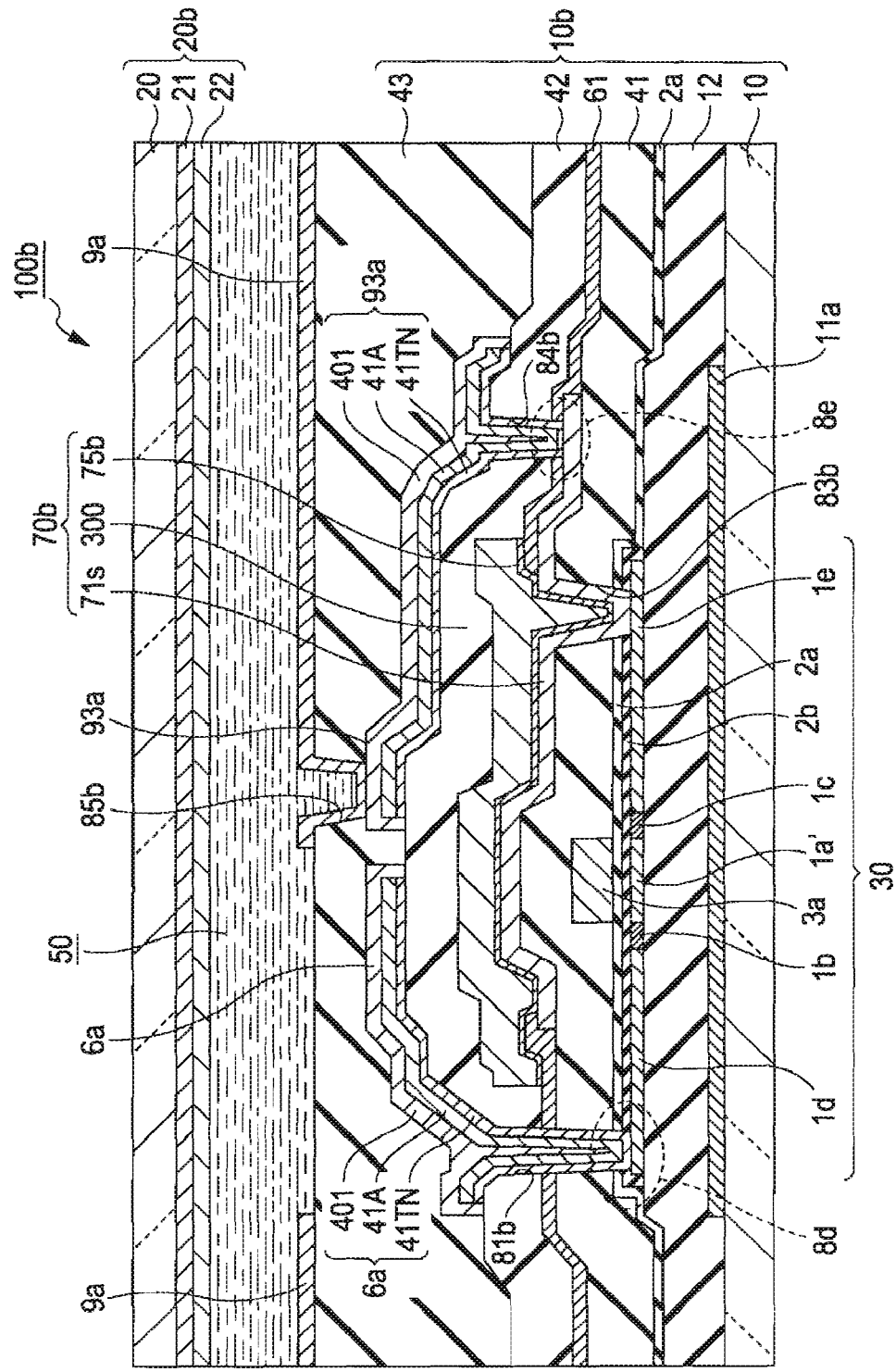
FIG. 12 is a sectional view of the pixel structure of a liquid crystal display device according to a second embodiment.

The plan view and sectional view of the liquid crystal display device 100b is shown in FIGS. 1A and 1B. FIG. 12 is a sectional view of the detailed pixel structure of the liquid crystal display device 100b. In this figure, the TFT substrate 10b including the base 10 to the pixel electrode 9a corresponds to an electro-optic device substrate of the invention.

A first layer on, for example, a glass or quartz base 10 includes scanning lines 11a. A base insulating layer 12 is formed of, for example, silicon oxide on the first layer.

A second layer on the base insulating layer 12 includes TFT elements 30. Each TFT element 30 includes a gate electrode 3a, a semiconductor layer channel region 1a' where a channel is formed by an electric field from the gate electrode 3a, insulating films 2a and 2b isolating the gate electrode 3a and the semiconductor layer from each other, and a lightly doped source region 1b, lightly doped drain region 1c, heavily doped source region 1d and heavily doped drain region 1e of the semiconductor layer. A first insulating interlayer 41 is formed of, for example, silicon oxide on the second layer.

A third layer on the first insulating interlayer 41 includes storage capacitors 70b. The storage capacitor 70b includes a lower electrode 71s, a dielectric film 75b, and a capacitor electrode 300. The capacitor electrode 300 has a titanium nitride/aluminum/titanium nitride metal-containing multilayer structure, and serves as the shield layer 400 of the liquid crystal display device 10a of the first embodiment. The lower electrode 71s is made of, for example, an electroconductive polysilicon. The lower electrode 71s is electrically connected to the heavily doped drain region 1e of the TFT element 30 through a contact hole 83b formed in the first insulating interlayer 41.

An etching stopper 61 made of, for example, HTO is formed at a portion between the lower electrode 71s and the dielectric film 75b. The etching stopper 61 protects the lower electrode 71s from an etchant or the like when the capacitor electrode 300 is etched. Thus, the capacitor electrode 300 and the lower electrode 71s can be patterned into different shapes from each other. In the present embodiment, the lower electrode 71s widely protrudes from the capacitor electrode 300. The lower electrode 71s is connected to a below-described relay electrode 93a at the protrusion.

A second insulating interlayer 42 is formed of, for example, silicon oxide on the third layer.

A fourth layer on the second insulating interlayer 42 includes data lines 6a and relay electrodes 93a. The data line 6a and the relay electrode 93a each have a multilayer structure including from below a titanium composite layer 41TN, an aluminum layer 41A, and a titanium nitride layer 401. The titanium composite layer 41TN includes a titanium layer 41a and a titanium nitride layer 41b as in the first embodiment (see FIG. 11A). The data line 6a is electrically connected to the heavily doped source region 1d of the TFT element 30 at the connection point 8d through the contact hole 81b. The relay electrode 93a is electrically connected to the lower electrode 71s of the storage capacitor 70b through the contact hole 84b at the connection point 8e.

The portion of the heavily doped source region 1d in contact with the titanium layer 41a is turned into a titanium silicide layer 1s (see FIG. 11A). Also, the portion of the lower electrode 71s in contact with the titanium layer 41a is turned into a titanium silicide layer 1s. Thus, the connection points 8d and 8e each have a polysilicon/titanium silicide/titanium multilayer structure as the connection points 8a, 8b, and 8c in the first embodiment. By forming the titanium silicide layer between the polysilicon layer and the titanium layer, an ohmic contact can be established at the connection points. Accordingly, sufficient electroconductivity can be ensured even if the area of connection is small. In the above-embodiment, the heavily doped source region 1d and the lower electrode 71s each correspond to a silicon layer in the invention.

The data line 6a and the relay electrode 93a each include a light-absorbing titanium layer 41a as the lowermost layer (on the side closer to the TFT element 30). The titanium layer 41a covers the entire surface of the base 10 side (TFT element 30 side) of the aluminum layer 41A. Consequently, the titanium layer 41a can prevent the reflection of light coming through the base 10, thus reducing the photo-leakage current from the TFT element 30 caused by the reflection. Thus, high quality display can be achieved without problems, such as flicker and nonuniformity.

A third insulating Interlayer 43 is formed of, for example, silicon oxide on the fourth layer.

A fifth layer on the third insulating interlayer 43 includes ITO pixel electrodes 9a. The pixel electrode 9a is electrically connected to a relay electrode 93a through a contact hole 85b formed in the third insulating interlayer 43.

The opposing substrate 20b includes a base 20, and an opposing electrode 21 and a polyimide alignment layer 22 on the base 20. The space between the TFT substrate 10b and the opposing substrate 20b is filled with liquid crystal to define a liquid crystal layer 50.

The thus configured liquid crystal display device 100b has a multilayer structure including five layers of the first to fifth layers, reducing the number of layers by one from that of the liquid crystal display device 100a of the first embodiment. This is an advantage because the numbers of photomasks and steps are reduced in the manufacturing process. In addition, the connection points 8d and 8e at which the polysilicon layer and a metal wire is connected with the titanium silicide layer 1s therebetween can reduce the contact resistance in comparison with the direct connection of the polysilicon layer with the metal wire. Furthermore, the data line 6a and the relay electrode 93a have the low-reflectance titanium layer 41a as the lowermost layer (at the base 10 side). The titanium layer 41a prevents the reflection of light coming through the base 10 to reduce the photo-leakage current from TFT element 30 caused by the reflection.

Electronic Apparatus

Figure 14A:
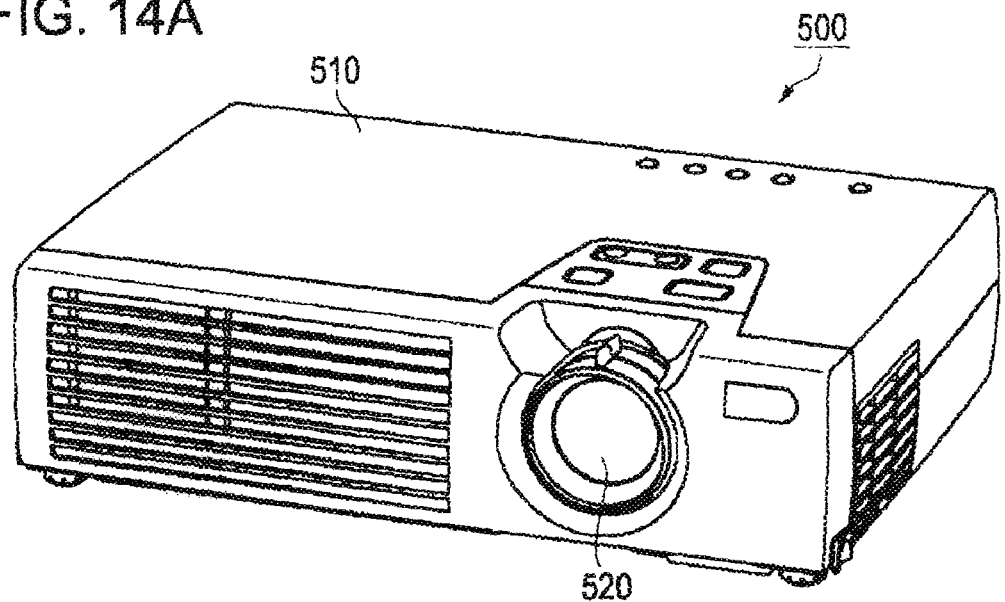
FIG. 14A is a perspective view of a projector being an electronic apparatus and FIG. 14B is a perspective view of a cellular phone being an electronic apparatus.

The above-described liquid crystal display device 100a (or 100b, the same applies to the following description) can be mounted on a projector 500 as shown in FIG. 14A, which is a type of electronic apparatus. The projector 500 includes a body 510 and a lens 520. The projector 500 emits light from a built-in light source (not shown) and projects the light on a built-in display portion, or modulates the light with the liquid crystal display device 100a acting as a light valve and then projects the light forward through the lens 520. This projector 500 can achieve high quality display without problems resulting from, for example, lack of written information in the TFT element 30 or photo-leakage current.

Figure 14B:
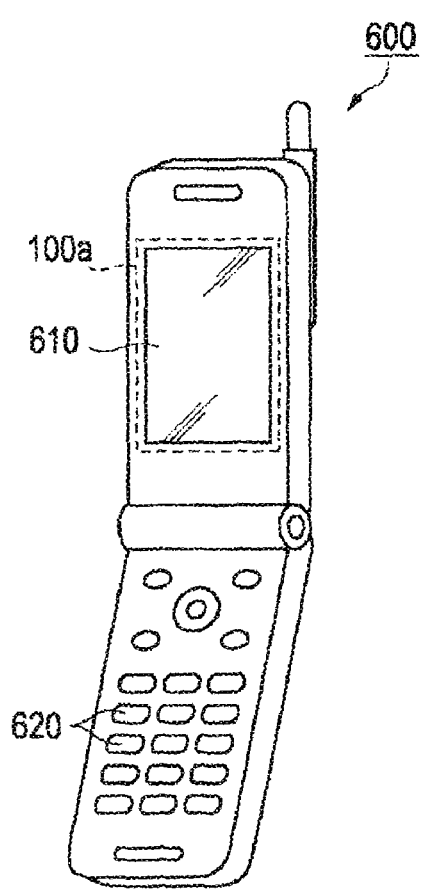

The liquid crystal display device 100a can be used in a cellular phone 600 as shown in FIG. 14B, which is a type of electronic apparatus. The cellular phone 600 includes a display portion 610 and control buttons 620. The liquid crystal display device 100a contained in the cellular phone 600 allows the display portion 610 to display information including data input with the control buttons 620 and received information without problems resulting from lack of written information in the TFT element 30 or photo-leakage current.

The liquid crystal display device 100a or 100b according to an embodiment of the invention can be used in various types of electronic apparatus, such as mobile computers, digital cameras, digital video cameras, vehicle-mounted apparatuses, and audio apparatuses, in addition to the projector 500 and the cellular phone 600.

While the invention has been described with reference to exemplary embodiments, it will be readily appreciated by those skilled in the art that various modifications may be made without departing from the scope and spirit of the invention. For example, the following modifications may be made.

Modification 1

Figure 13A:
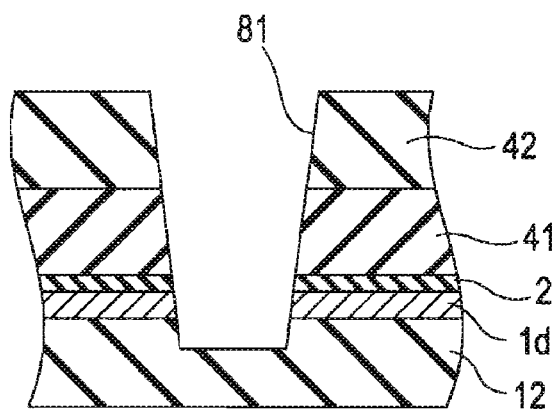
FIGS. 13A to 13C are sectional views showing a manufacturing process of a TFT substrate and a liquid crystal display device according to a modification of the invention.

When the contact hole 81 is formed in the second insulating interlayer 42, the contact hole 81 may pass through the heavily doped source region 1d of the TFT element 30 (corresponding to the silicon layer in the invention) depending on the variation of etching rate (FIG. 13A). In this instance, the metal wire (for example, the data line 6a) in the contact hole 81 comes into contact with the heavily doped source region 1d at a section of the heavily doped source region 1d. In such a case, the contact area is generally short and the contact resistance is accordingly increased. The invention can prevent such a problem.

Figure 13B:
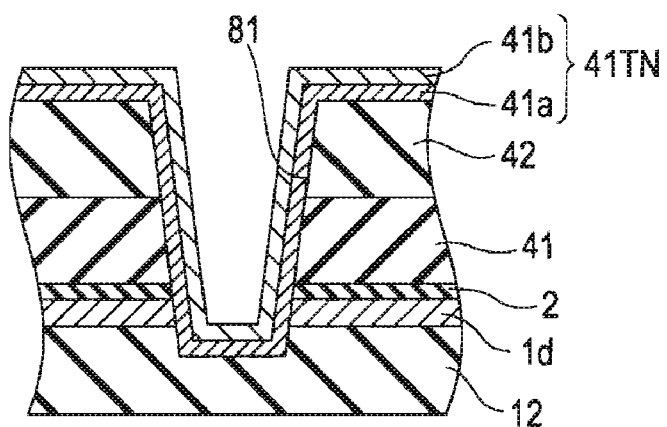
Figure 13C:
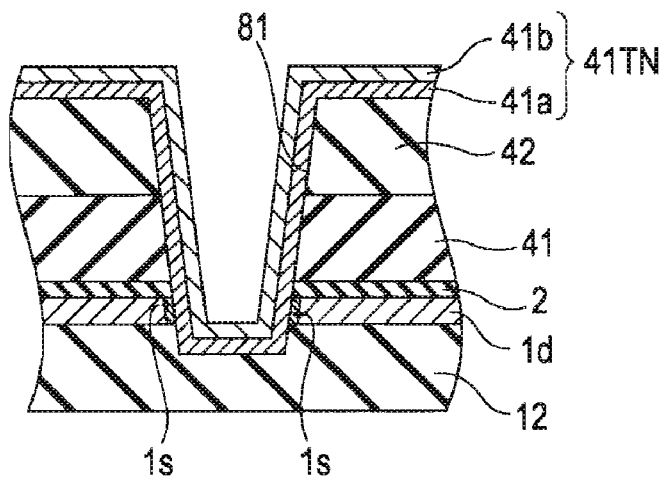

Specifically, a titanium layer 41a and a titanium nitride layer 41b are formed in the contact hole 81 passing through the heavily doped source region 1d (FIG. 13A) in the same manner as in the above-described embodiments (FIG. 13B), followed by annealing. Thus the portion in contact with the titanium layer 41a at a section of the heavily doped source region 1d, that is, the inner wall of the through hole in the heavily doped source region 1d, can be silicided. For example, in this modification, a titanium silicide layer is formed at such a portion (FIG. 13C). Consequently, the contact between the heavily doped source region 1d and the titanium layer 41a has a polysilicon/titanium silicide/titanium multilayer structure and can establish a small-area connection with a low resistance. According to this modification, even if the contact hole 81 passes through the silicon layer, such as the heavily doped source region 1d, the silicon layer can be connected to a metal wire at the inner wall of the contact hole with a low resistance.

The above description illustrates the connection point 8a of the heavily doped source region 1d and the data line 6a, and the same effect can be produced at the connection points 8b, 8c, 8d, and 8e.

Modification 2

While in the above-described embodiments, the titanium silicide layer 1s provided between the silicon layer and the titanium layer is mainly made of $Ti_5Si_3$, the titanium silicide layer may be made of, for example, $TiSi_2$, if it is annealed at higher temperatures.

Modification 3

While in the above-described embodiments, the electro-optic device substrate is used in the liquid crystal display device 100a or 100b being an electro-optic device, the electro-optic device substrate of the invention can be used in various types of electro-optic devices, such as electroluminescent devices and electrophoresis apparatuses.

The entire disclosure of Japanese Patent Application No. 2006-191089, filed Jul. 12, 2006 is expressly incorporated by reference herein.

What is claimed is:

1. A method for manufacturing an electro-optic device substrate, comprising:
    forming a TFT element having a source region and a drain region on a base, the TFT element including a silicon layer in the source region or the drain region;
    forming an insulating layer on the silicon layer;
    forming a contact hole in the insulating layer;
    forming a titanium layer so as to be in contact with the silicon layer at the contact hole in an atmosphere;
    forming a titanium nitride layer on the titanium layer in equipment that is the same as equipment used for the forming the titanium layer; and
    annealing the base having the layers up to the titanium nitride layer to silicide the portion of the silicon layer in contact with the titanium layer, thereby forming a titanium silicide layer, the titanium silicide layer being formed between the silicon layer and the titanium layer, and the annealing being performed after the forming of the titanium nitride layer on the titanium layer.

2. The method according to claim 1, the annealing being performed at a temperature in the range of 300 to 400° C.

3. The method according to claim 1, the titanium nitride layer being formed in the same atmosphere as in the formation of the titanium layer.

* * * * *